United States Patent
Akimoto et al.

[11] Patent Number: 5,980,591
[45] Date of Patent: Nov. 9, 1999

[54] SYSTEM FOR PROCESSING A PLURALITY OF OBJECTS CONTAINED IN A PLURALITY OF CASSETTES

[75] Inventors: Masami Akimoto; Shizuo Ogawa; Toshihiko Nagano, all of Kumamoto, Japan

[73] Assignee: Tokyo Electron Limited, Tokyo, Japan

[21] Appl. No.: 08/916,441

[22] Filed: Aug. 22, 1997

Related U.S. Application Data

[62] Division of application No. 08/427,871, Apr. 26, 1995, Pat. No. 5,803,932.

[30] Foreign Application Priority Data

Apr. 26, 1994 [JP] Japan .................................. 6-110421

[51] Int. Cl.⁶ .................................................. G06F 15/46
[52] U.S. Cl. ................................. 29/25.01; 364/468.02; 364/468.07; 364/468.23; 364/468.28; 364/478.05; 364/478.07; 364/478.14
[58] Field of Search ....................... 29/25.01; 364/468.02, 364/468.07, 468.23, 468.28, 478.05, 478.07, 478.14

[56] References Cited

U.S. PATENT DOCUMENTS

| | | |
|---|---|---|
| 4,825,808 | 5/1989 | Takahashi et al. . |
| 4,917,556 | 4/1990 | Stark et al. . |
| 4,923,584 | 5/1990 | Bramhall, Jr. et al. . |
| 4,974,166 | 11/1990 | Maney et al. . |
| 4,985,722 | 1/1991 | Ushijima et al. . |
| 5,067,218 | 11/1991 | Williams . |
| 5,135,608 | 8/1992 | Okutani . |
| 5,166,884 | 11/1992 | Maney et al. . |
| 5,310,410 | 5/1994 | Begin et al. . |
| 5,442,561 | 8/1995 | Yoshizawa et al. . |

FOREIGN PATENT DOCUMENTS

| | | |
|---|---|---|
| 59-219925 | 12/1984 | Japan . |
| 5-178416 | 7/1993 | Japan . |

*Primary Examiner*—David E. Graybill
*Attorney, Agent, or Firm*—Oblon, Spivak, McClelland, Maier & Neustadt, P.C.

[57] ABSTRACT

A processing system comprising a loading/unloading section, a processing section and an interface section. The system further comprises a convey mechanism and at least two waiting sections. The convey mechanism can move in either direction between between the loading/unloading section and the interface section, for conveying objects to the processing units included in the processing section and conveying objects in either direction between the loading/unloading section and the interface section. The waiting sections are provided for temporarily holding an object before the convey mechanism conveys an object to the interface section.

33 Claims, 21 Drawing Sheets

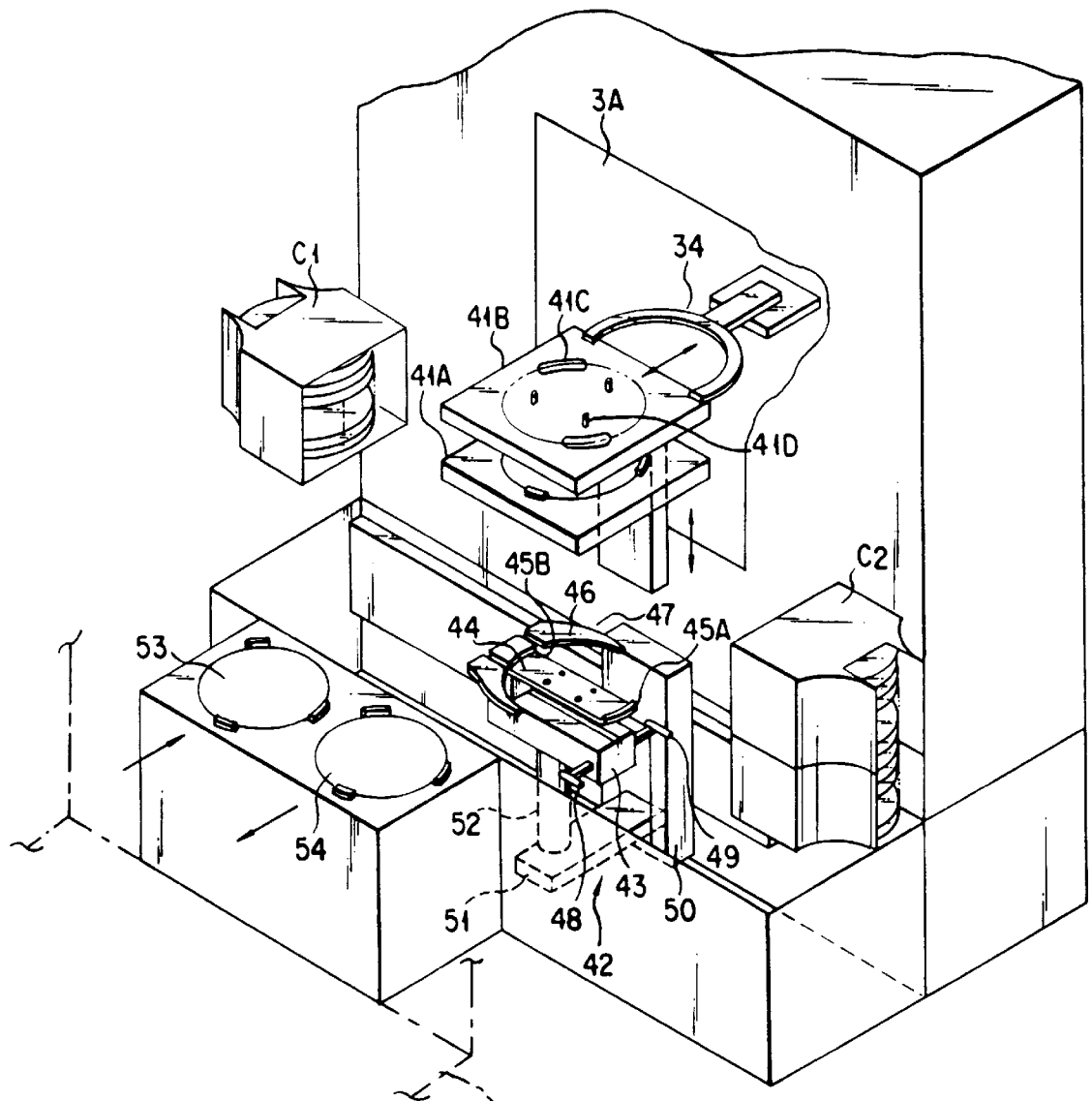
EXPOSURE APPARATUS
F I G. 2

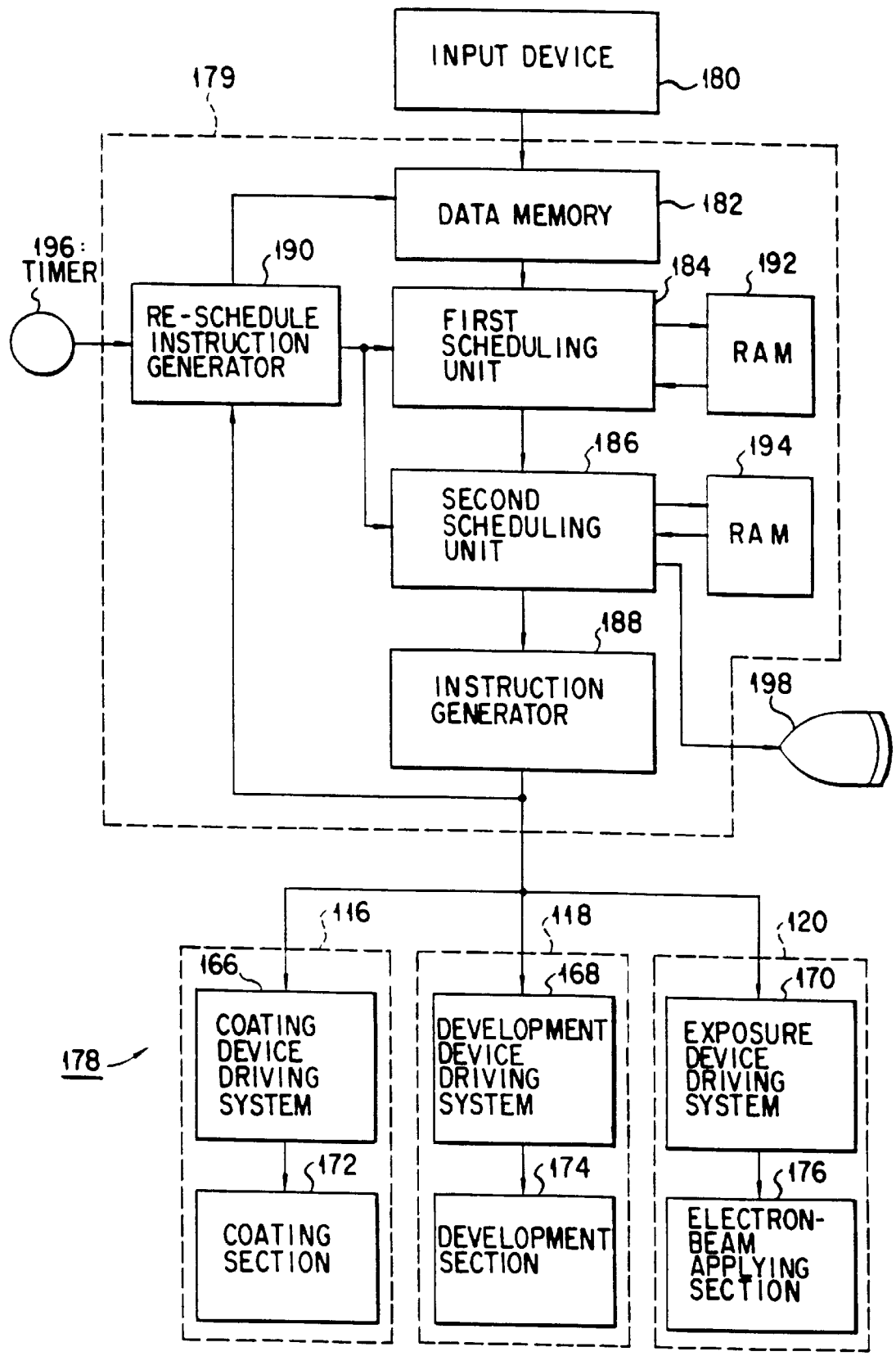
F I G. 12

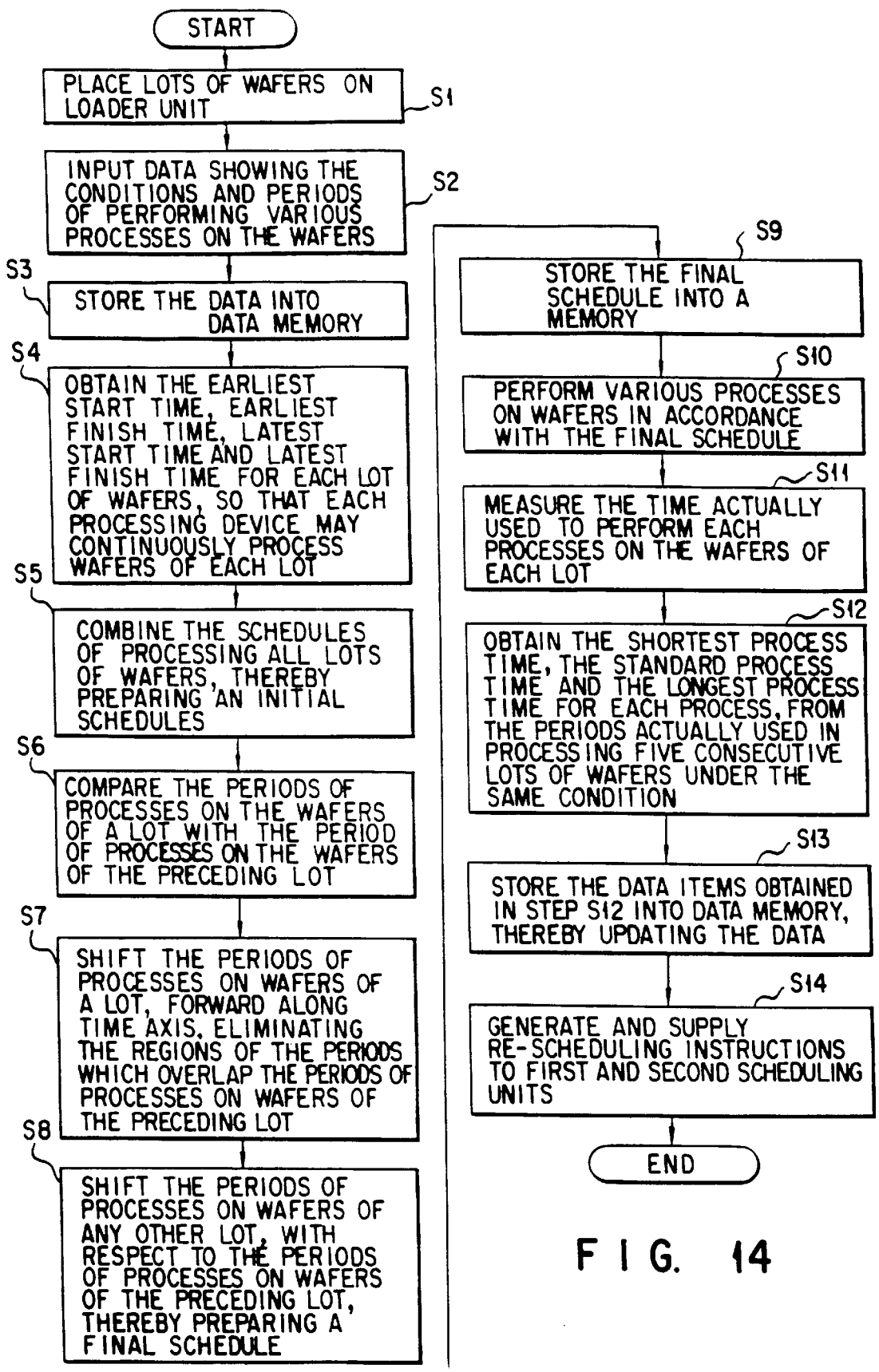
F I G. 14

| | LOT NUMBER : LOT 1 | |
|---|---|---|
| RESIST - COATING | EARLIEST START TIME = xx:xx,<br>EARLIEST FINISH TIME = xx:xx, | LATEST START TIME = xx:xx<br>LATEST FINISH TIME = xx:xx |
| DEVELOPMENT | EARLIEST START TIME = xx:xx,<br>EARLIEST FINISH TIME = xx:xx, | LATEST START TIME = xx:xx<br>LATEST FINISH TIME = xx:xx |
| EXPOSURE | EARLIEST START TIME = xx:xx,<br>EARLIEST FINISH TIME = xx:xx, | LATEST START TIME = xx:xx<br>LATEST FINISH TIME = xx:xx |
| | LOT NUMBER : LOT 2 | |
| RESIST - COATING | EARLIEST START TIME = xx:xx,<br>EARLIEST FINISH TIME = xx:xx, | LATEST START TIME = xx:xx<br>LATEST FINISH TIME = xx:xx |
| DEVELOPMENT | EARLIEST START TIME = xx:xx,<br>EARLIEST FINISH TIME = xx:xx, | LATEST START TIME = xx:xx<br>LATEST FINISH TIME = xx:xx |
| EXPOSURE | EARLIEST START TIME = xx:xx,<br>EARLIEST FINISH TIME = xx:xx, | LATEST START TIME = xx:xx<br>LATEST FINISH TIME = xx:xx |

FIG. 15

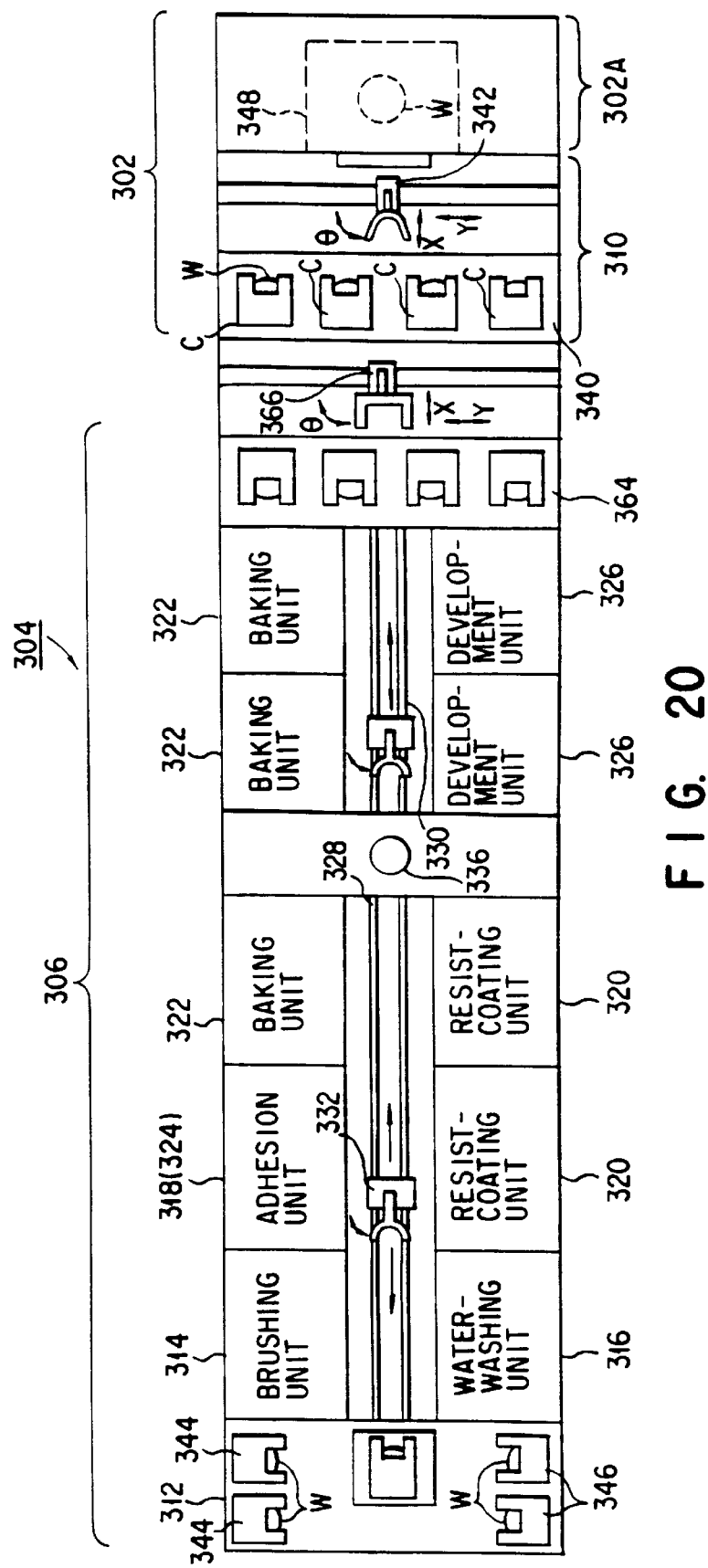
F I G. 20

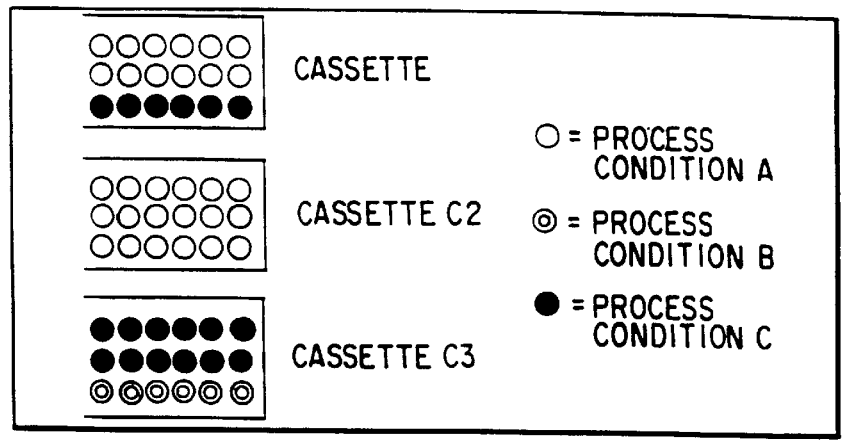
F I G. 24
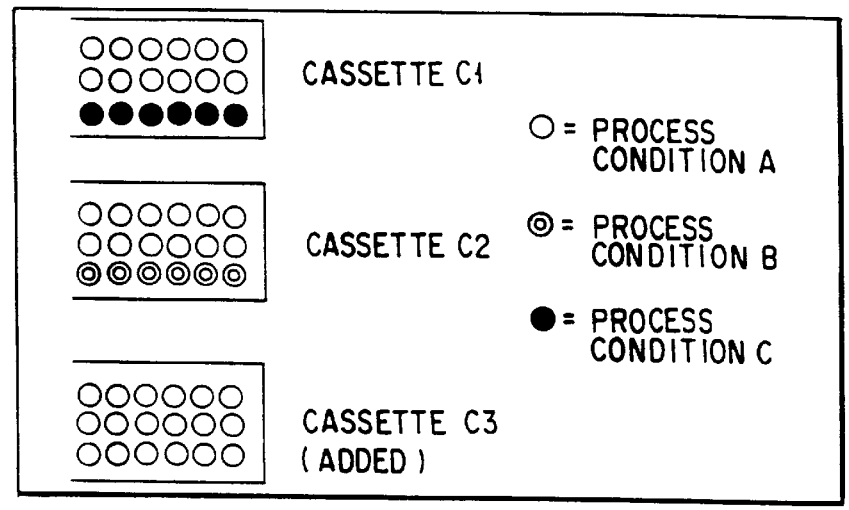
F I G. 25
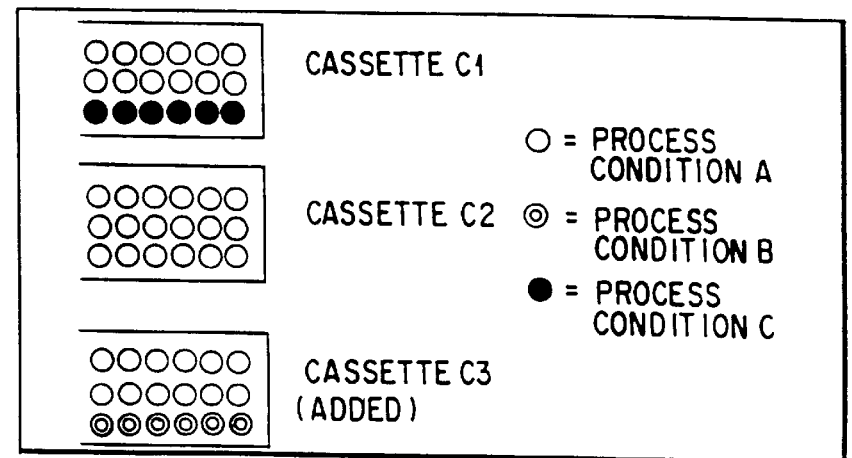
F I G. 26

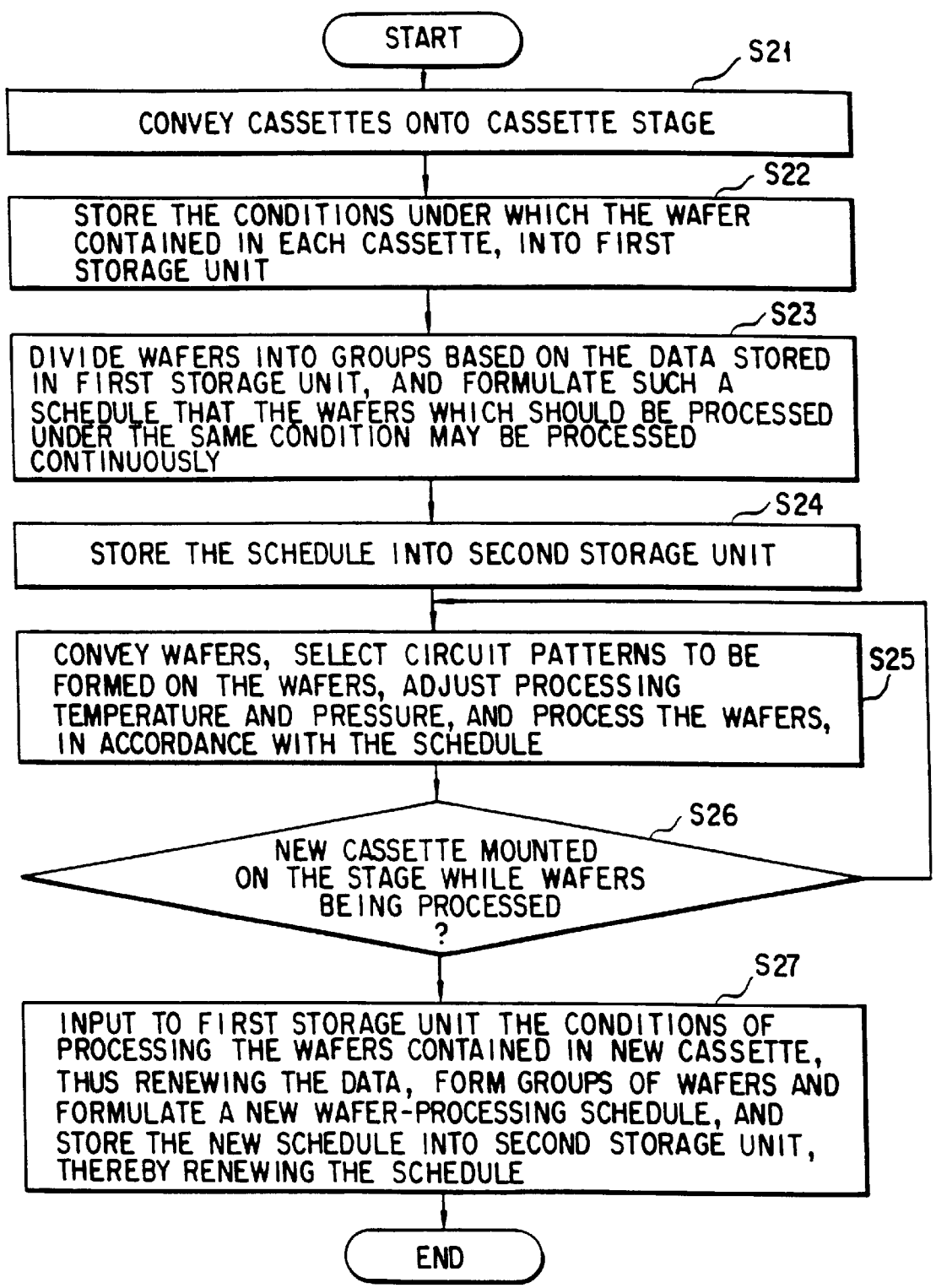
F I G. 27

SYSTEM FOR PROCESSING A PLURALITY OF OBJECTS CONTAINED IN A PLURALITY OF CASSETTES

This is a Division of application Ser. No. 08/427,871 filed on Apr. 26, 1995, U.S. Pat. No. 5,803,932.

BACKGROUND OF THE INVENTION

1. Field of the Invention

The present invention relates to a system for processing objects.

2. Description of the Related Art

Semiconductor devices are manufactured by performing a number of processes on semiconductor wafers (hereinafter referred to as "wafers") to a number of processes. To save space in the factory, the processing systems are laid out in the best possible manner. For the same purpose, the conveyer units designed to convey wafers from one process unit to another and the interfaces connecting the processing systems are made as small as possible. Further, to enhance the throughput of manufacture, it is necessary to convey wafers at the highest efficiency possible.

FIG. 1 shows a conventional resist-processing system which is designed to form a resist film on a wafer and to develop the resist film. As shown in FIG. 1, the system comprises a process unit A and an interface unit B. The process unit A has two convey paths 11 and 12 at its center section and two convey arms 13 and 14 provided in the convey paths 11 and 12, respectively. The process unit A further comprises an adhesion section, two baking section, a cooling section, two coating sections, and two development sections. The adhesion section and the first baking section are located on one side of the first convey path 11, and both coating sections on the other side thereof. The second baking section and the cooling section are arranged on one side of the second convey path 12, and both development sections on the other side thereof. (These sections are designated at the same reference numeral of "15."). The process unit A has a table 16 located between the convey paths 11 and 12, for holding wafers W that are to be conveyed from the process unit A to the interface unit B, or vice versa.

The interface unit B is positioned adjacent to the process unit A. The interface unit B is provided for transport wafers W between an exposure apparatus (not shown) and the process unit A. The interface unit B has an intermediate table 21, two buffer cassettes 22, a convey mechanism 23, a wafer-receiving table 24 and a wafer-sending table 25. The intermediate table 21 is located adjacent to the process unit A, can be moved up and down and can be cooled. The buffer cassettes 22 are provided on the sides of the intermediate table 21. The convey mechanism 23 is located at the back of the intermediate table 21 and can move along X, Y and Z axes and can rotate in the direction of arrow θ. The wafer-receiving table 24 and the wafer-sending table 25 are arranged farther from the intermediate table 21 than the convey mechanism 23. In other words, they are closer to the exposure apparatus (not shown) than the convey mechanism 23.

In operation, the first convey arm 13 conveys a wafer W onto the table 16, and the second convey arm 14 conveys the wafer W from the table 16 onto the intermediate table 21. The wafer W is cooled, if necessary, while mounted on the intermediate table 21. Thereafter, the convey mechanism 23 conveyers the wafer W from the intermediate table 21 onto the wafer-sending table 25. The wafer W is conveyed from the table 25 to the exposure apparatus (not shown).

A wafer W subjected to exposure process in the exposure apparatus is conveyed onto the wafer-receiving table 24. Then, the convey mechanism 23 conveys the wafer W from the table 24 onto the intermediate table 21. If wafers W are conveyed from the exposure apparatus to the resist-processing system at a higher rate than from the resist-processing system to the exposure apparatus, wafers W will be kept stored temporarily in the buffer cassettes 22.

A wafer W not exposed to light yet may rest on the intermediate table 21, while a wafer W already exposed to light rests on the wafer-receiving table 24. In this instance, the convey mechanism 23 conveys the unexposed wafer W from the intermediate table 21 into the buffer cassettes 22. Then, the mechanism 23 is moved to the wafer-receiving table 24, takes the exposed wafer W from the table 24, is moves back to the intermediate table 21, and places the exposed wafer W on the table 21. Next, the mechanism 23 is moved to the buffer cassettes 22, takes the unexposed wafer W out of the cassette 22 and mounts it on the wafer-sending table 25. This done, the convey mechanism 23 is moved to the intermediate table 21 and stays there until another unexposed wafer W is placed on the table 21.

The convey mechanism 23 needs to move twice to the buffer cassettes 22 in order to convey each unexposed wafer W to the wafer-sending table 25. Obviously, it takes longer to convey the unexposed wafer W to the table 25 than in the case where the mechanism 23 needs to move only once to the cassette 11. To make matters worse, the mechanism 23 cannot convey the next wafer unless no wafers are mounted on the intermediate table 21.

An example of the interface unit B is disclosed in Jpn. Pat. Appln. KOKAI Publication No. 1-318247. The interface unit disclosed the publication cannot work if the process unit A has only one convey through which wafers W are conveyed toward or from the process unit A. Since the interface unit has no buffer cassettes, time is wasted when the timing of conveying wafers in the process unit A greatly differs from the timing of conveying wafers between the interface unit B and the exposure apparatus.

SUMMARY OF THE INVENTION

The object of the present invention is to provide a system for processing objects at high throughput.

According to the present invention, there is provided a processing system which comprises a loading/unloading section, a processing section and an interface section. The system further comprises a convey mechanism and at least two waiting sections. The convey mechanism can move in either direction between the loading/unloading section and the interface section, for conveying objects to the processing units included in the processing section and conveying objects in either direction between the loading/unloading section and the interface section. The waiting sections are provided for temporarily holding an object before the convey mechanism conveys an object to the interface section.

In the system of the invention, it is desired that the waiting sections are arranged one above the other. Also it is preferred that one of the waiting sections have cooling means. Further it is desired that one of the waiting sections be equipped with a support which can support an object. Still further, it is desired that one or both of the waiting sections is provided, exclusively for holding an object to be convened to the processing section.

With the system having the structure described above, an object already processed by the next-stage apparatus is be held in one of the waiting sections so that an object to be processed may be immediately conveyed from another waiting section to a next-stage apparatus. It is therefore possible to shorten the time for conveying an object to the next-stage apparatus and to increase the throughput of the processing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a perspective view showing the main components of a processing system according to a first embodiment of the present invention;

FIG. 12 is a block diagram showing a part of the processing system shown in FIG. 11;

FIG. 14 is a flow chart explaining how the processing of objects is scheduled in the system of FIG. 11;

FIG. 15 is a table depicting the principle of scheduling the processing of objects in the system shown in FIG. 11;

FIG. 20 is a plan view of the processing system according to the third embodiment of the invention;

FIGS. 24 to 26 are diagrams explaining the conditions in which objects contained in containers are processed and the order in which the objects are processed;

FIGS. 27 and 28 is a flow chart explaining how the objects are put together to form groups and how the schedule of processing the objects is prepared.

DETAILED DESCRIPTION OF THE PREFERRED EMBODIMENTS

Embodiments of the present invention will now be described, with reference to the accompanying drawings.

Embodiment 1

The system which is the first embodiment of the invention is designed to coat resist on a wafer and develop the resist film coated on the wafer.

Figure 3:
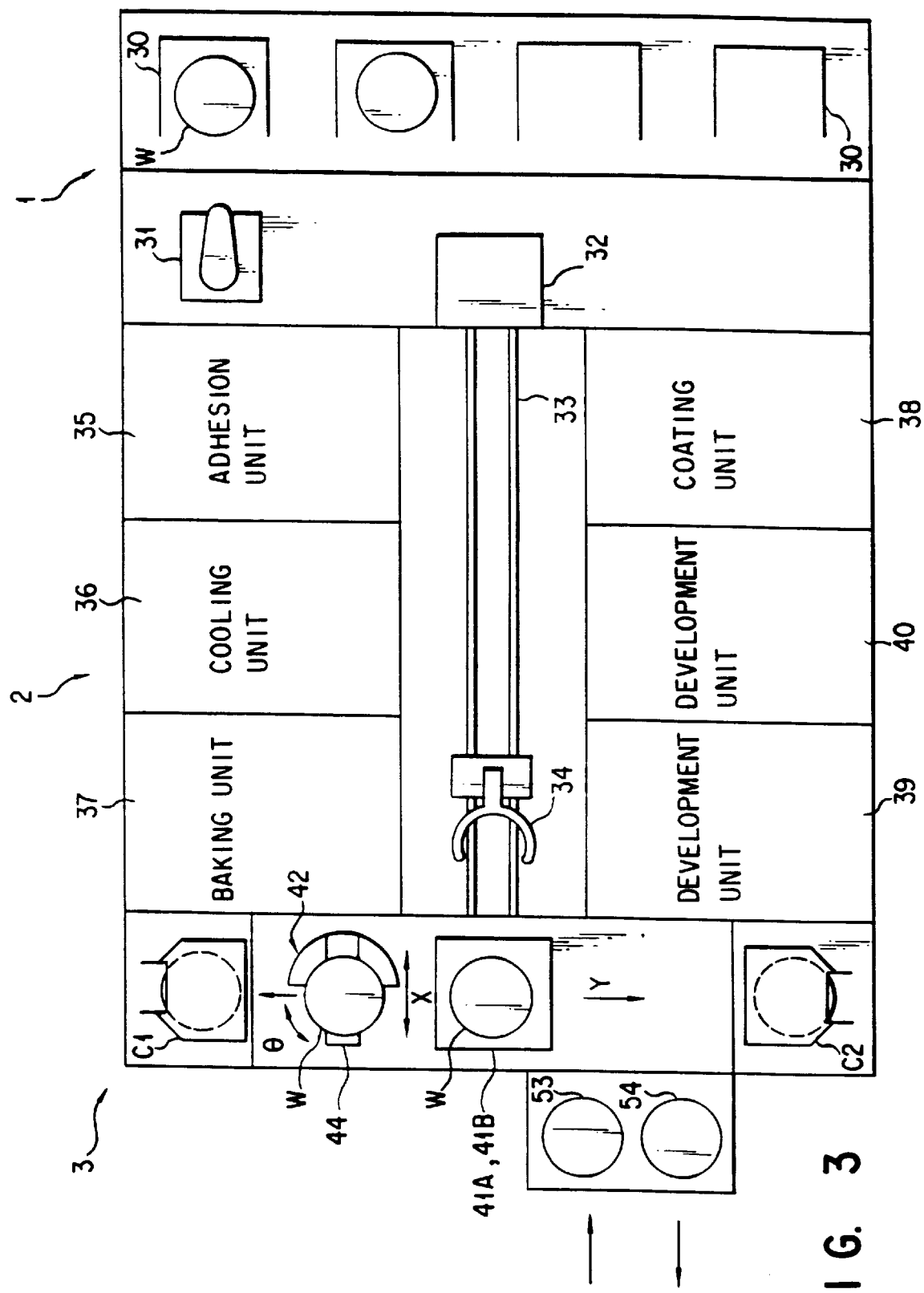
FIG. 3 is a plan view of a processing system according to the first embodiment of the invention.

As shown in FIG. 3, the system comprises a loading/unloading section 1, a processing section 2 and an interface section 3. The loading/unloading section 1 is designed to load and unloading a wafer W. The processing section 2 is arranged adjacent to the loading/unloading section 1. The section 2 comprises an adhesion unit 35, a cooling unit 36, a baking unit 37, a coating unit 38 and two development units 39 and 40. The interface section 3 is located adjacent to the processing section 2, for conveying wafers W between the processing section 2 and the next-stage processing apparatus (not shown) such as an exposure apparatus.

The loading/unloading section 1 has four wafer cassettes 30, a convey arm 31 and a wafer table 32. Each cassette 30 is provided for holding wafers W. The convey arm 31 is located between the processing section 2 and the wafer cassettes 30 in order to convey wafers W from the cassettes 30 to the processing section 2. The arm 31 has two metal pins and a rotary mechanism. The pins are used to supporting a wafer W. The rotary mechanism is designed to convey a wafer W from any wafer cassette 30 to the processing section 2. The convey arm 31 conveys an unprocessed wafer W from any cassettes 30 to the wafer table 32, places it at a prescribed position on the table 32, conveys a processed wafer W from the processing section 2 to the table 32, places it at the prescribed position on the table 32, conveys it from the table 32 to any cassette 30, and mounts it on the cassette 30.

The processing section 2 has a convey path 33, which extends along a center line of the section 2. The section 2 comprises a main convey arm 34. The main convey arm 34 can move back and forth along the convey path 33. Further, the arm 34 can move up and down and can rotate. The arm 34 has two metal pins for supporting a wafer W. Arranged along and on one side of the path 33 are the adhesion unit 35, the cooling unit 36, the baking unit 37. Arranged along and on the other side of the path 33 are the coating unit 38 and the development units 39 and 40.

The interface section 3 comprises at least two waiting units, for example, two intermediate tables 41A and 41B for temporarily holding a wafer W each. As shown in FIG. 2, the tables 41A and 41B are spaced apart in vertical direction and oppose a wafer port 3A provided at the end of the convey path 33.

The first intermediate table 41A incorporates means for maintaining a processed wafer W at such a prescribed temperature as would not influence the next process to be performed on the wafer W. In the present embodiment, the means is either an electronic cooling unit such as Peltier element or a cooling unit using a coolant (e.g., cooling water or cooling gas). Hence, the first intermediate table 41A serves not only to hold a processed wafer W temporarily, but also to adjust the temperature of the processed wafer W to a desired value. The first intermediate table 41A is equipped with a support unit, e.g., three support pins (not shown) which project from the upper surface of the table 41A, thereby to hold the wafer W at an elevated position above the table 41A. The first intermediate table 41A may be secured to the main frame of the interface section 2. Alternatively, it may be designed so as to move in vertical direction.

As is shown in FIG. 2, the second intermediate table 41B is fixed to the main frame of the interface section 3. The table 41B has guides 41C and support pins 41D. The guides 41C are located on the upper surface of the table 41B so as to abut on the circumferential edge of a wafer W, thereby positioning the wafer W on the second intermediate table 41B. Each guide 41C has sides which are inclined such that its width decreases from the top surface toward the lower surface. The support pins 41D are loosely inserted in the holes made in the table 41B. The pins 41D can project upwards from the upper surface of the table 41B to lift a wafer W.

The second intermediate table 41B is used as waiting section for temporarily supporting a processed wafer W (exposed to light) before the main convey arm 34 conveys the wafer W to the development unit 40. The table 41B may contains cooling means of the same type as incorporated in the first intermediate table 41A. Since the intermediate table 41A and 41B serve to temporarily hold an unprocessed wafer W and a processed wafer W, respectively, the wafers W are maintained free from contamination.

Located below the intermediate tables 41A and 41B is a convey mechanism 42, which can be move along a covey path extending at right angles to the convey path 33. The convey mechanism 42 comprises a base 43 and a holder 44. The base 43 can be move up and down and can rotate. The holder 44 is shaped like a plate, provided for holding a wafer W; it is mounted on the base 43 and can be move back and forth.

The holder 44 has stepped portions 45A and 45B for positioning a wafer W when the wafer W is mounted onto the holder 44. The base 43 has two positioning members 47 located on the sides of the path in which the holder 44 can be moved. Each member 47 has a curved edge 46. When the holder 44 holding a wafer W is moved to its rearmost position, the wafer W abuts on the edges 46 of the members 47. The centering of the wafer W is thereby accomplished.

A mapping sensor is provided at the front end of the base 43. The sensor comprises a light-emitting element 48 and a light-receiving element 49. The elements 48 and 49 are fastened to the sides of the base 43, respectively, and are spaced apart from each other so that the circumferential edge of a wafer W may be located between them. As the base 43 is moved back and forth, the mapping sensor is moved toward and away from a buffer cassette C (later described) in order to determine whether or not the cassette C contains a wafer W.

The convey mechanism 42 further comprises a movable member 50, a platform 51 and a shaft 52. The member 50 can move along the convey path when driven by, for example, a ball-screw mechanism. The platform 51 is coupled to the movable member 50 and extends horizontally; it can move vertically by, for example, a ball-screw mechanism. The shaft 52 extends upward from the platform 51 and can be rotated in the direction of arrow θ shown in FIG. 3. It is to the top of the shaft 52 that the base 43 is secured. The holder 44, which is connected to the base 43, can therefore move in the directions of arrow X, Y and Z and rotated in the direction of arrow θ.

A wafer-receiving table 53 and a wafer-sending table 54 are provided adjacent to the convey mechanism 42 and faces away from the processing section 2. The tables 53 and 54 have a guide each, for holding the circumferential edge of a wafer W. The wafer-receiving table 53 is used to support a processed wafer W supplied from the next-stage processing apparatus (e.g., an exposure apparatus). The wafer-sending table 54 is used to hold an unprocessed wafer W to be supplied to the exposure apparatus. These tables 53 and 54 are arranged at the positions determined by the height at which the path for conveying wafers W to and from the exposure apparatus is located.

On the other hand, the intermediate tables 41A and 41B are arranged at the positions determined by the height at which the convey path 33 is located in the processing section 2. The convey path of the holder 44 is located below the intermediate tables 41A and 41B. Elevator mechanisms may be provided to move the wafer-receiving table 53 and the wafer-sending table 54 up and down. One or more buffer cassettes C1 are provided near one end of the convey path of the convey mechanism 42, and one or more buffer cassettes C2 near the other end of the convey path of the mechanism 42. Each of these buffer cassettes C1 and C2 is designed to temporarily hold a plurality of wafers W and supported by a support member (not shown). The intermediate tables 41A and 41B and the convey mechanism 42 overlap one another so that wafers W may be transferred between the exposure apparatus and the convey path 33 of the processing section 2.

Although not shown in FIG. 2 or FIG. 3, the system further comprises controllers, microcomputers and a central control device. The controllers and the microcomputers are provided to control the loading/unloading section 1, the processing section 2 and the interface section 3. The central control device has a computer for controlling the controllers and the microcomputers. Thus, the central control device controls the sections 1, 2 and 3 in accordance with a particular process program.

It will now be explained how the system having the structure described above operates to coat resist on a wafer and develop the resist film coated on the wafer.

First, the convey arm 31 extracts one of the unprocessed wafers W from one of the wafer cassettes 30 of the loading/unloading section, conveys it to the wafer table 32 and places it at the predetermined position on the table 32.

Next, the main convey arm 34 conveys the wafer W from the wafer table 32 to the adhesion unit 35, which performs adhesion process on the wafer W. The arm 34 then conveys the wafer W from the adhesion unit 35 to the cooling unit 36, which cools the wafer W. The arm 34 conveys the wafer W from the cooling unit 36 to the coating unit 38, which spin-coats resist on the wafer W. The arm 34 conveys the wafer W from the coating unit 38 to the baking unit 37, which bakes the wafer W, evaporating the solvent from the resist. Thereafter, the arm 34 conveys the wafer W from the baking unit 37 to the cooling unit 36, which cools the wafer W which has been heated to a high temperature in the baking unit 27. Alternatively, the main convey arm 34 may be driven to convey the wafer W among the units 35 to 38 in a different order.

Then, the main convey arm 34 conveys the wafer W, now with a resist film formed on it, to the first intermediate table 41A of the interface section 3 through the wafer port 3A, placing the wafer W on the support pins (not shown) which project from the upper surface of the table 41A. The wafer W remains at an elevated position above the table 41A until it is conveyed to the holder 44. If necessary, the wafer W is cooled to a predetermined temperature of, for example, 20° C., at which the wafer W can be reliably exposed to light. If the exposure is delayed in the exposure apparatus (not shown) for some reason, the wafer W is temporarily held in the buffer cassette C2.

Next, the convey mechanism 42 is moved upwards to the first intermediate table 41A. The holder 44 is thereby located below the wafer W and inserted into the gap among the support pins of the table 41A which are moving upwards. The holder 44 is further moved lightly upward, lifting the wafer W now placed on the tips of the support pins. The holder 44 is then lowered, thereby placing the wafer W at the prescribed position on the wafer-sending table 54. The wafer W is conveyed from the table 54 into the exposure apparatus at an appropriate time. After exposed to light, the wafer W is conveyed from the exposure apparatus and set at the prescribed position on the wafer-receiving table 53.

The convey mechanism 42 is driven as mentioned above, whereby the holder 44 lifts the wafer W until the wafer W is mounted on the support pins 41D of the second intermediate table 41B which are moving upwards. The holder 44 is then moved away from the pins 41D, and the support pins 41D are lowered. As a result, the wafer W is mounted on the second intermediate table 41B, appropriately positioned thereon by the guides 41C. The wafer W remains on the table 41B until the main convey arm 34 reaches it. The temperature of the wafer W may be adjusted (for example by cooling) to the temperature at which the resist film formed on the wafer W can be best developed. If the development is delayed in the development unit 39 for some reason or another, the wafer W is temporarily held in the buffer cassette C1.

The main convey arm 34 holds the wafer W on the table 41B, which has been exposed to light. The arm 34 conveys the wafer W into the development unit 39, in which development solution is sprayed onto the spinning wafer W, thus developing the resist film formed on the wafer W. Alternatively, the arm 34 may convey the wafer W into the other development unit 40, in which the resist film is developed, and then convey the wafer W into the baking unit 37, in which the wafer W is heated. Thereafter, the main convey arm 34 removes the wafer W from either the development unit 39 or the baking unit 37 and convey it onto the wafer table 32. The convey arm 31 conveys the wafer W into the wafer cassette 30 provided in the loading/unloading section 1.

It will be described in detail how a wafer W is conveyed within the interface section 3. Assume that neither the interface section 3 nor the exposure apparatus (not shown) contains wafers W to be processed, and that the main convey arm 34 needs to convey the first wafer W of a lot into the interface section 3.

The main convey arm 34 holds the wafer W with a resist film formed on it, moves passing through the wafer port 3A, and places the wafer W on the first intermediate table 41A. While resting on the table 41B, the wafer W is cooled to, for example, 23° C. The convey mechanism 42 is driven such that the holder 44 receives the wafer W from the table 41A. The holder 44 is then lowered and then moved to the wafer-sending table 54, not toward the buffer cassette C1.

Then, the wafer W is transferred from the holder 44 onto the table 54. The wafer-receiving table 53, which holds no wafers, is moved to the first intermediate table 41A. The wafer W is conveyed from the wafer-sending table 54 into the exposure apparatus, exposed to light therein, conveyed from the apparatus, and mounted on the wafer-receiving table 53.

The convey mechanism 42 receives the next wafer W to be processed from the first intermediate table 41A if the wafer W has been cooled to the prescribed temperature so as to be well exposed to light. More precisely, the holder 44 conveys the wafer W to and places it on the wafer-sending table 54. If the wafer W already exposed to light rests upon the wafer-receiving table 53, the convey mechanism 42 receives this wafer W, conveys it to the second intermediate table 41B and sets it on the table 41B. If the main convey arm 34 conveys the next wafer W to it, the convey mechanism 42 conveys it directly to the main convey arm 34.

The convey mechanism 42 is repeatedly driven in the way described above, thereby conveying wafers W between the interface section 3 and the exposure apparatus, one at a time. The time required to process a wafer W in the processing section 2 (hereinafter referred to as "cycle time") differs from the time required to process a wafer W in the exposure apparatus. If the cycle time of the exposure apparatus is long, or if the operating efficiency of the exposure apparatus decreases since the exposure process is suspended due to a trouble occurring in the apparatus, it is impossible to convey a wafer W immediately from the interface section 3 into the exposure apparatus. In this case, the wafer W cooled while held on the table 41A is stored in the buffer cassette C1 until the wafer in the exposure apparatus is duly exposed to light and removed from the exposure apparatus. Wafers W are removed from the cassette C1 on a first-in, first-out basis, so that processing history of the wafers may be managed well.

To insert a wafer W into or remove it from the buffer cassette C1 with high efficiency, the mapping sensor is used to determine whether or not a wafer or wafers are stored in the cassette C1. To be more specific, the convey mechanism 42 is moved forward until a part of any wafer W in the cassette C1 is placed in the space between the light-emitting element 48 and the light-receiving element 49. This done, the base 43 of the mechanism 42 is lowered from the uppermost of the wafer racks provided in the cassette C1, to the lowermost of the wafer racks. The encoder (not shown) connected to a servo motor (not shown, either) detects the height of each rack in the cassette C1. The signal output by the light-receiving element 49 and the data generated by the encoder are supplied to the control section (not shown). From the signal and the data the control section quickly detects the presence or absence of a wafer W on each rack and the position of a wafer W, if any in the cassette C1. The holder 44 is stopped at the height the control section has detected, whereby high-speed mapping is achieved. The mapping sensor may be intermittently moved, instead of being continuously moved, in order to accomplish the mapping.

Figure 4:
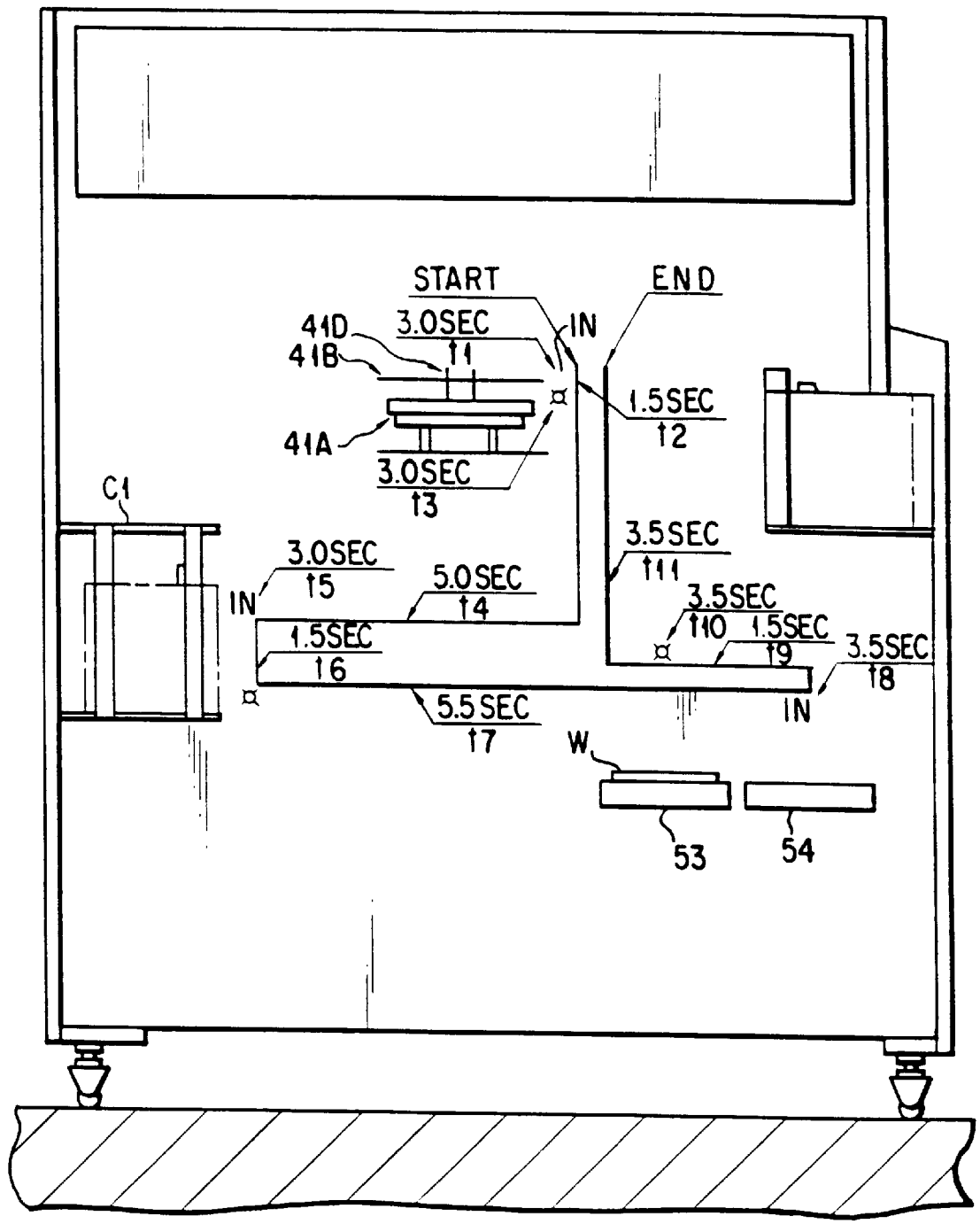
FIG. 4 is a diagram for explaining how the convey mechanism conveys an object in the interface section of the system.

How much time the convey mechanism 42 requires to convey a wafer W from any position to another in the interface section 3 will be explained, with reference to FIG. 4. Assume that the holder 44 holds a wafer W exposed to light and that the mechanism 42 starts operating to convey the wafer W onto the second intermediate table 41B.

It takes time $t_1$ (e.g., 3.0 seconds) to transfer the wafer W from the holder 44 to the table 41B. The holder 44 needs time $t_2$ (e.g., 1.5 seconds) to move downward to the level at which to transfer the wafer W to the table 41B. The holder 44 requires time $t_3$ (e.g., 3.0 seconds) to wait until it receives a cooled wafer W from the first intermediate table 41A. It requires time $t_4$ (e.g., 5.0 seconds) to move first downward and then horizontally to convey the cooled wafer W to the buffer cassette C1. It needs time $t_5$ (e.g., 3.0 seconds) to load the wafer W into the buffer cassette C1. It needs time $t_6$ (e.g., 1.5 seconds) to move to the wafer W which is the first to supply from the interface section 3. The holder 44 requires time $t_7$ (e.g., 5.5 seconds) to remove a wafer W from the cassette C1 and convey it to the wafer-sending table 54. It requires time $t_8$ (e.g., 3.5 seconds) to transfer the wafer W onto the table 54. Further, it requires time t(e.g., 1.5 seconds) to move from the table 54 to the wafer-receiving table 53. It also needs time $t_{10}$ (e.g., 3.5 seconds) to wait until it receives a wafer W exposed to light, from the wafer-receiving table 53. It requires time $t_{11}$ (e.g., 3.5 seconds) to move up from the table 53 to the second intermediate table 41B. Thus, the cycle time $T_A$ is, for example, 34.5 seconds ($=t_1+t_2+\ldots t_{11}$).

Figure 1:
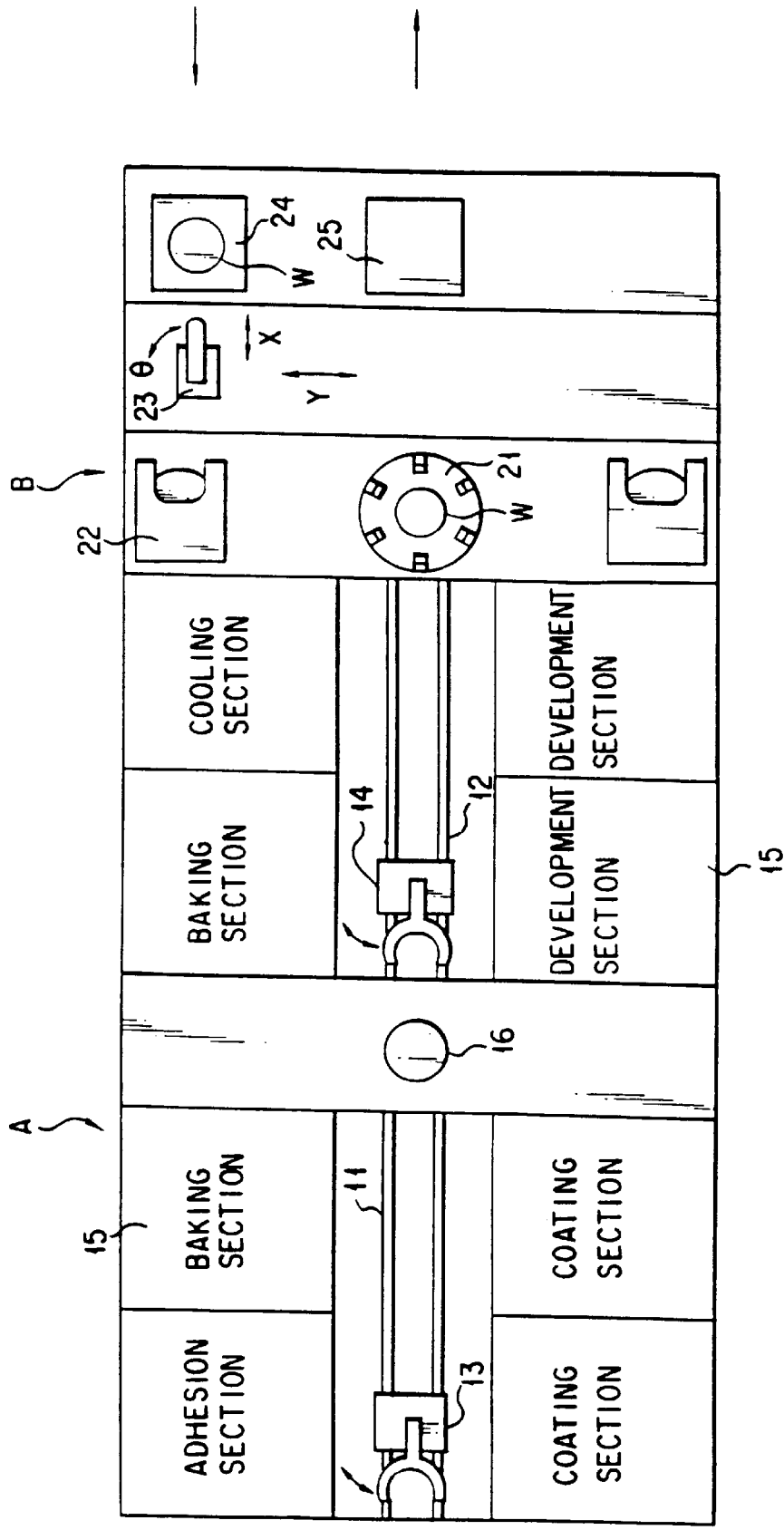
FIG. 1 is a plan view of a conventional processing system having a convey mechanism.
Figure 5:
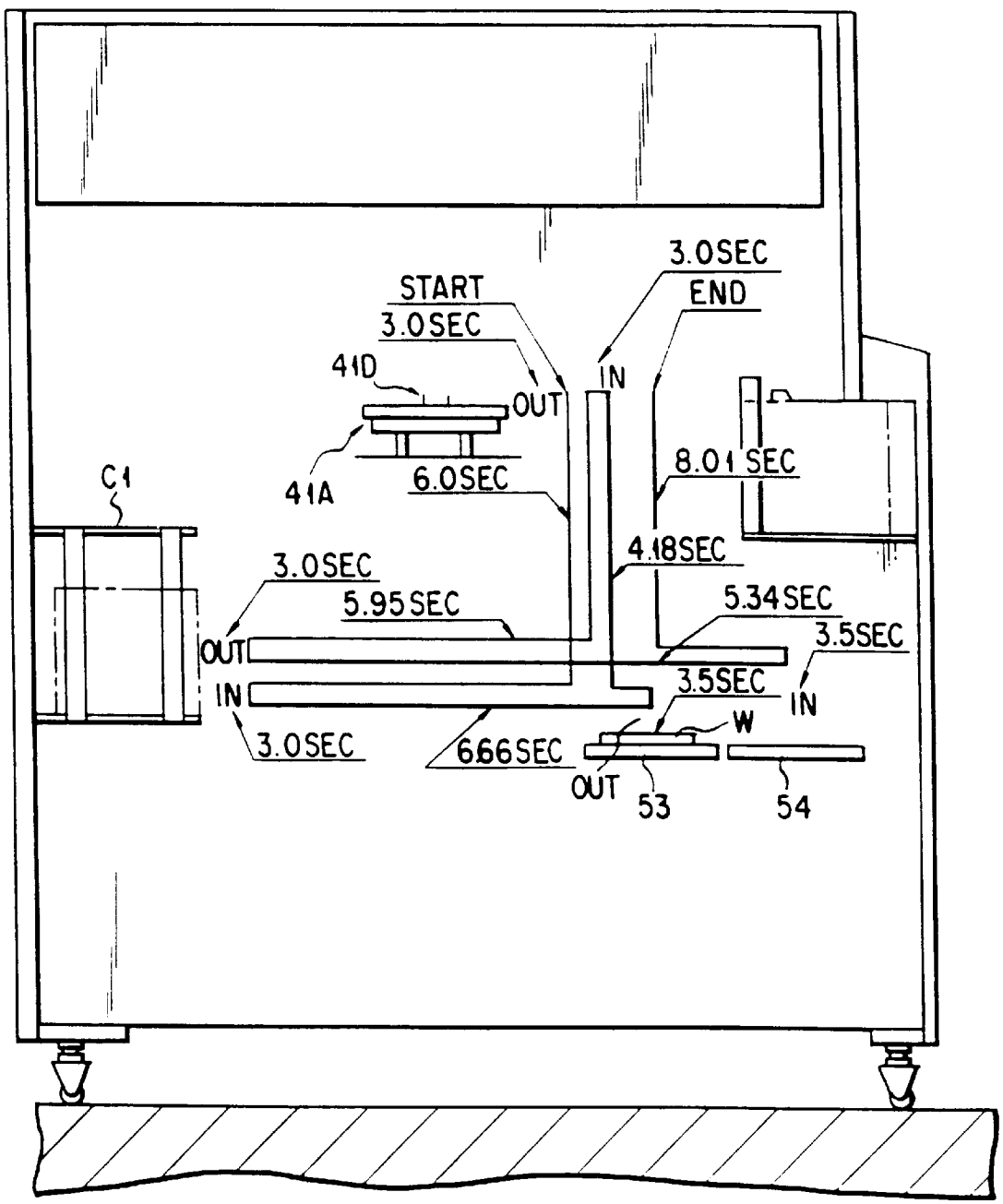
FIG. 5 is a diagram for explaining how the convey mechanism conveys an object in the conventional processing system shown in FIG. 1.

If the processing system had only one intermediate table 41A, not having the other intermediate table 41B, as in the conventional processing system (FIG. 1), the cycle time would be longer as will be explained below, with reference to FIG. 5.

Assume that the holder 44 is at first located near the intermediate table 41A. The holder 44 needs time $t_{21}$ (e.g., 3.0 seconds) to wait until it receives a cooled wafer W from the table 41A. It requires time $t_{22}$ (e.g., 6.0 seconds) to reach the buffer cassette C1. It requires $t_{23}$ (e.g., 3.0 seconds) to load the wafer W into the cassette C1. The holder 44 requires time $t_{24}$ (e.g., 6.66 seconds) to move the wafer-receiving table 53 in order to hold a wafer W exposed to light. It needs time $t_{25}$ (e.g., 3.5 seconds) to place the wafer W onto the table 53. It needs time $t_{26}$ (e.g., 4.18 seconds) to move to its initial position, i.e., the intermediate table 41A. Further, the holder 44 requires time $t_{27}$ (e.g., 3.0 seconds) and time $t_{28}$ (e.g., 5.95 seconds) to move to the cassette C1. It needs time $t_{29}$ (e.g., 3.0 seconds) to remove a wafer W to be exposed to light, from the buffer cassette C1. It needs time $t_{30}$ (e.g., 5.34 seconds) to move to the wafer-sending table 54. Further, it requires time $t_{31}$ (e.g., 3.5 seconds) to mount the wafer W onto the table 54. The holder 44 needs time $t_{32}$ (e.g., 8.01 seconds) to move back to its initial position, i.e., the intermediate table 41A. As a result, the cycle time $T_B$ is 55.14 seconds ($=t_{21}+t_{22}+\ldots t_{32}$). This cycle time is about 20 seconds longer than the cycle time $T_A$ in the interface section 3 of the system according to the present invention.

Since the first embodiment has two intermediate tables (i.e., the tables 41A and 41B), the next wafer W can be immediately conveyed onto, for example, the table 41A unless no other wafer W is mounted on the table 41A, and can therefore be cooled while resting on the table 41A. For the same reason, a wafer W already exposed to light can be immediately placed on the table 41B unless any other wafer W is mounted on the table 41B, and can be immediately conveyed to the processing section 2 by means of the main convey arm 34.

As described above, the first embodiment of the invention has two intermediate tables 41A and 41B. Instead, it may have two or more intermediate tables. The tables 41A and 41B, both used as waiting sections, are located one above the other. Alternatively, the tables 41A and 41B may be arranged side by side, in the same horizontal plane. In the case where three or more intermediate tables are provided, at least one of them may be used exclusively in conveying wafers W to the processing section 2, while the others are used in conveying wafers W to the section 2 and receiving them from the section 2.

Figure 6:
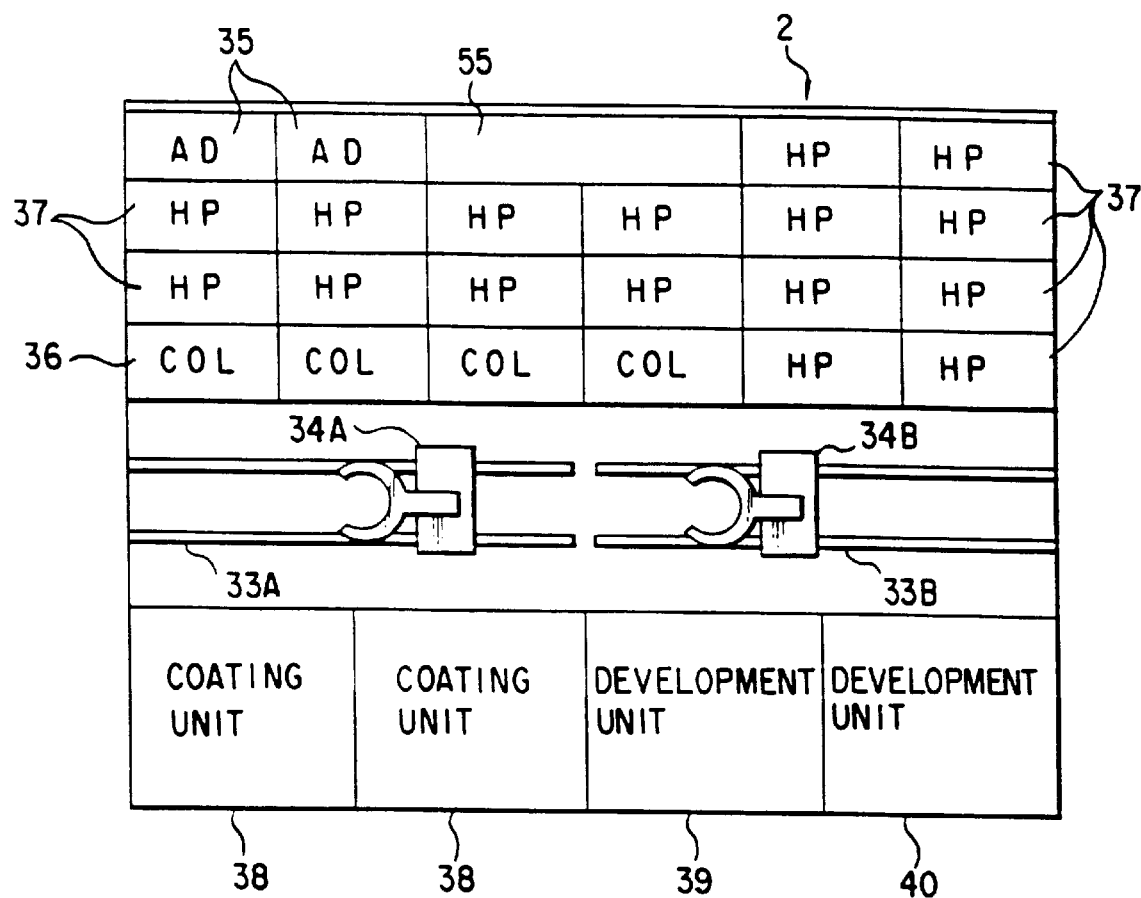
FIG. 6 is a plan view showing a modification of the processing section of the system.

The processing section 2 may have the structure shown in FIG. 6, instead of the structure illustrated in FIG. 3. The components identical or similar to those shown in FIG. 3 are designated at the same reference numerals in FIG. 6.

The processing section 2 shown in FIG. 6 has two main convey paths 33A and 33B which are set in axial alignment, extending along a center line of the section 2 and separated from each other by a narrow space. A main convey arm 34A is provided, movable along the convey path 33A. Similarly, a main convey arm 34B is provided, movable along the convey path 33B. On one side of the paths 33A and 33B, two coating units 38 and two development units 39 and 40 are arranged in a line parallel to the paths 33A and 33B. On the other side of the paths 33A and 33B there are provided adhesion units 35, cooling units 36 and baking units 37. The processing section 2 has a waiting unit 55 for holding a wafer W until the wafer or any other wafer is conveyed between the main convey arms 34A and 34B.

Although the adhesion units 35, the cooling units 36 and the baking units 37 are presented in FIG. 6 as if arranged side by side in the same horizontal plane. In fact, however, the units 35, 36 and 37 are located in different horizontal planes. For instance, the adhesion units 35 is positioned in the highest plane, the baking units 37 in the intermediate plane, and the cooling units 36 the lowest plane. The waiting unit 55 is located in the highest plane, but can be arranged in either the intermediate plane or the lowest plane. Any one of the cooling units 36 may replace the waiting unit 55. Furthermore, each baking unit 37 is used exclusively to perform pre-baking after resist has been coated on the wafer W, post-baking after the resist film on the wafer W has been developed, or post-exposure baking after the wafer W has been exposed to light.

The baking units 37 have a processing chamber each. If a controller is provided for each processing chamber in order to control the temperature in the chamber, the manufacturing cost of the system will be enormously high. To reduce the manufacturing cost, a multi-channel controller (e.g., a 4- or 8-channel controller) can be utilized so that the temperatures in the processing chambers of the units 37 may be controlled independently.

The temperature of the resist solution applied in the coating units 38 and the temperature of the developing solution applied in the development units 39 and 40 may be adjusted by the heat-exchanging units provided for the solutions—without using devices designed to control the temperatures of the solutions. The processing section 2 can thus be rendered simple in structure. In addition, resist solutions controlled in temperature under the same condition may be supplied to both coating units 38, and developing solutions controlled in temperature under the same condition may be supplied to both development units 39and 40. This helps to render each process uniform and stable.

The more processing sections the system has, or the greater the diameter of the wafers to be processed, the larger will the processing system become. The larger the system, the longer the main convey paths 33A and 33B, and the longer the time required to convey a wafer W. To increase the throughput of processing, the main convey arms 34A and 34B must be moved at a higher speed. It is preferred that the speeds of the arms 34A and 34B be gradually changed at the start and end of acceleration and at the start and end of deceleration. (The speed of either main convey arm should be so controlled that the speed-time relationship may be represented by a S-shaped curve.) In other words, the main convey arms 34A and 34B should be neither accelerated or decelerated at high rate. If the arms 34A and 34B are moved under this speed control, they do not vibrate as in the convention system (FIG. 1) and can move at high speed after all.

In the present embodiment, various units may be automatically controlled such that after the last wafer W of a lot is conveyed out of each baking unit 37, the temperature in each baking unit 37 is set to a value suitable for processing the wafers W of the next lot, or that one of the baking unit 37 whose internal temperature has been set to the value suitable for processing the wafers W of a lot is selected and the wafers W of this lot are conveyed, one at a time, into the baking unit 37 selected. If so, the wafers W of a lot can be baked immediately after the wafers W of the preceding lot have been baked.

In the first embodiment, the main convey arm 34B, for example, can convey a wafer W exposed to light and supplied from the interface section 3, into one of the baking units 37 located in the right half region (FIG. 6) of the processing section 2 so that this wafer W may be subjected to post-exposure baking. Over-baking of the wafer W can be prevented, merely by supporting the wafer W by support pins (not shown) in the baking unit 37, spaced above the heating plate (not shown) incorporated in the baking unit 37. The wafer W may need to remain on the support pins for a time longer than a preset baking time, until the main convey arm 34B comes to the baking unit 37 next time. In this case, the wafer W is baked for a time shorter than the preset baking time than the difference between that longer time and the preset baking time. As a result, the wafer W is prevented from being excessively baked, and the timing of the completion of baking coincides with the timing of the removal of the wafer W from the baking unit 37. After removed from the unit 37, the wafer W is conveyed to one of the cooling units 36 and cooled therein to, for example, normal temperature. Therefore, wafers W can be baked and cooled over the same period of time, whereby the wafer-processing can be made uniform. This time control is important, particularly in processing resist films of chemically amplified type.

The first embodiment of the invention is not limited to a system for coating resist on wafers and developing the resist films formed on the wafers. Rather, it can be applied to a system which is designed to coat resist on LCD substrates, glass substrates or the like and to develop resist films formed on the substrates.

Embodiment 2

The second embodiment of this invention provides a scheduling method and a scheduling system. The method and the system much reduce the time for which an object needs to wait until it is subjected to any one of the processes performed by a plurality of processing devices. The the object may therefore be processed completely within a short period of time.

The scheduling system is designed to control drive systems incorporated in processing devices, in such a manner that an object is continuously conveyed to the processing devices and continuously subjected to various processes in the processing devices. The system comprises input means, data storage means, first scheduling means, second scheduling means, instructing means, and re-scheduling instructing means. When operated, the input means inputs data representing prescribed periods which the processing devices require to process objects under various conditions. The data storage means is provided to store the data input by operating the input means. The first scheduling means is used to prepare, based on the data stored in the data storage means, at least two initial schedules, i.e., a schedule of processing objects of a group and a schedule of processing objects of the next group. Each schedule is such that a processing device finishes processing the last object of the group, at the same time or before the next-stage processing device starts processing the first wafer of the group. The second scheduling means is provided to prepare a final schedule by comparing the schedules made by the first scheduling means and by delaying the schedule of processing the objects of the next group, if the schedules overlap, thereby eliminating the overlapping of the schedules and preparing a final schedule. The instructing means is designed to generate instructions based on the final schedule and supplies the instructions to the drive systems. The re-scheduling instructing means can update the data stored in the data storage means based on the periods which the processing devices actually requires to process the objects, and can instruct both scheduling means to make new schedules. The data input by operating the input means may include three data items representing the shortest period, a standard period the longest period, each required to process the objects.

In the case the objects to be processed are sheets, the data input by operating the input means represents prescribed periods which the processing devices require to process a predetermined number of sheets, e.g., five sheets or ten sheets. The devices process sheets in units of five sheets, one data item may show the time each device requires to process first five sheets under a specific condition, and the next data item may represent a longer or shorter time the device requires to process the next five sheets under a different condition. As described above, any data item input is stored into the data storage means.

The first scheduling means prepares at least two initial schedules based on the data stored in the data storage means, i.e., a schedules of processing objects of a group and a schedule of processing objects of the next group. Each schedule is such that a processing device finishes processing the last object, at the same time or before the next-stage processing device starts processing the first wafer. The second scheduling means compares the schedules made by the first scheduling means. If the schedules are found to overlap, the second scheduling means delays the schedule of processing the objects of the next group, thereby eliminating the overlapping of the schedules and preparing a final schedule.

The instructing means generates instructions based on the final schedule and supplies the instructions to the drive systems. In accordance with the instructions the drive systems are driven whereby the sheets are processed, group by group, as they are continuously conveyed from one processing device to another.

The final schedule has been formulated such that objects to be processed in the same processing unit over a longer time than in any other processing unit may be processed immediately after other objects have been processed in the same processing unit. For example, if the time required for the first process is shorter than the time required for any other process, the start of the first process is delayed with respect to any other process. Hence, sheets can be conveyed into the processing units one after another and subjected to various processes, virtually without being kept waited.

The re-scheduling instructing means measures the period of time each processing device has actually spent to process the sheets of each group. The average of the periods which the device required to process the groups of sheets is stored into the data storage means, thus updating the data stored in the data storage means. The re-scheduling instructing means then instructs both the first scheduling means and the second scheduling means to make new schedules which are more reliable and more similar to the actual sequence of processing.

As indicated above, the data input by operating the input means can include three data items representing the shortest period, a standard period the longest period, each required to process the objects. This enables both first scheduling means to prepare schedules each having a time margin.

The scheduling method and the scheduling system, both according to the second embodiment of the invention, will now be described in detail with references to FIGS. 7 to 18.

Figure 7:
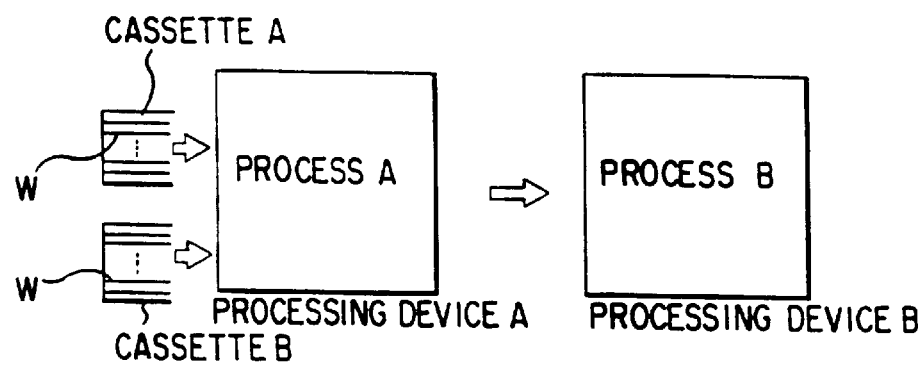
FIG. 7 is a diagram illustrating a processing system and explaining a scheduling method according to the invention.
Figure 8:
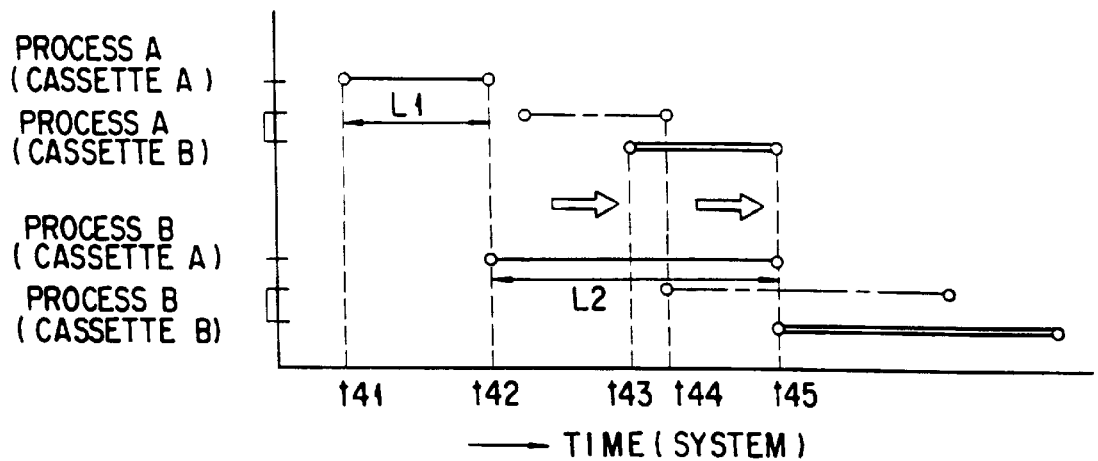
FIG. 8 is a timing chart explaining the principle of the scheduling method.
Figure 9:
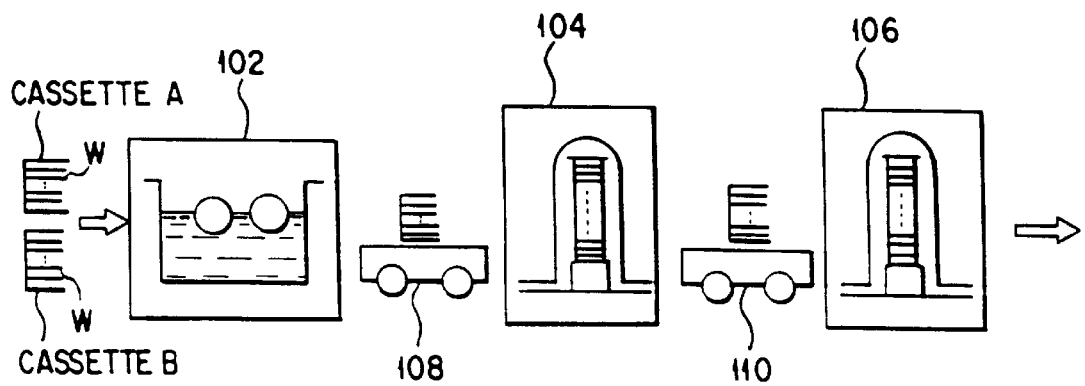
FIG. 9 is a diagram showing a processing system capable of effecting batch processing, and explaining the principle of the scheduling method applied to this processing system.
Figure 10:
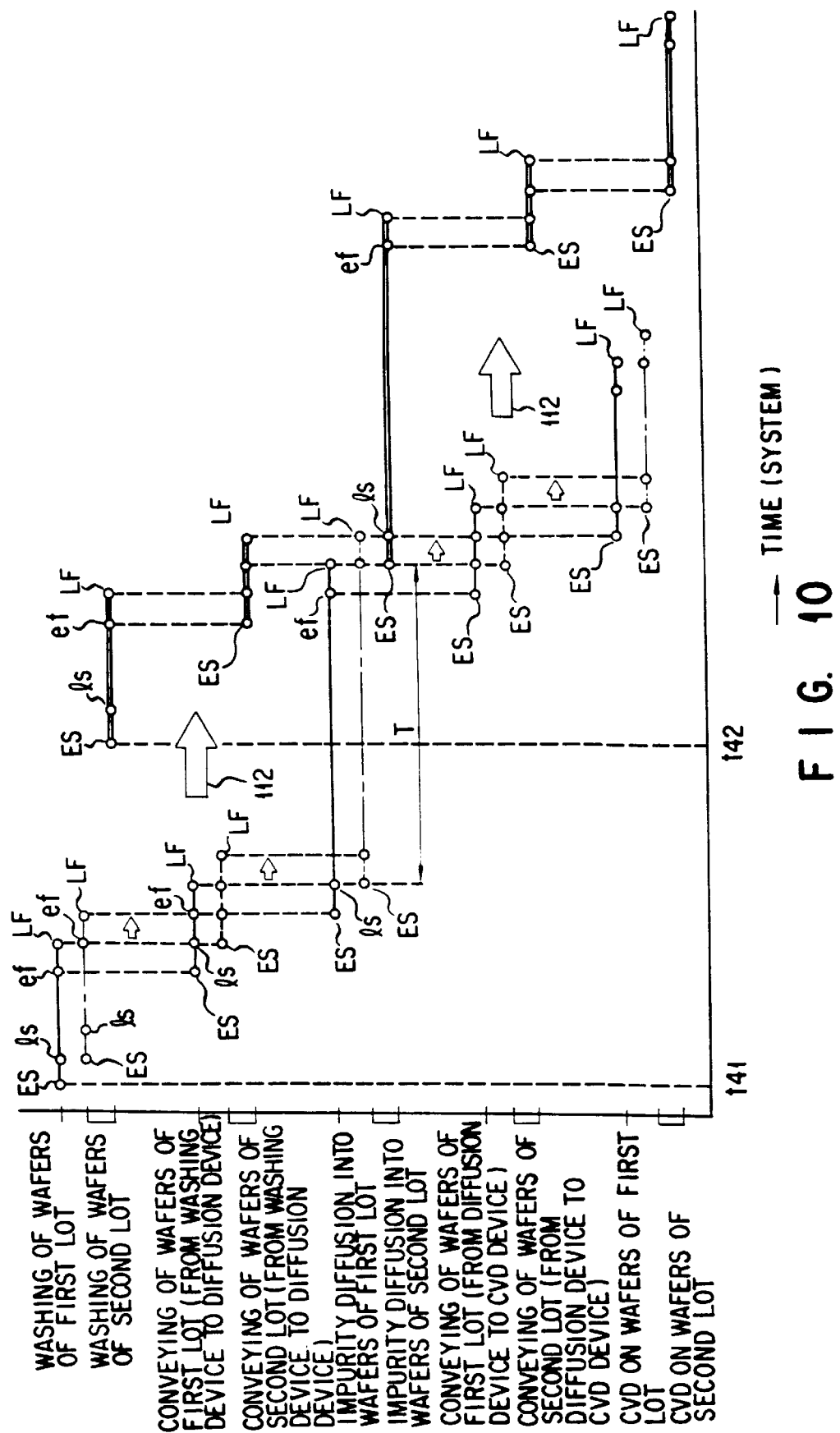
FIG. 10 is a timing chart representing the principle of the scheduling method.

FIG. 7 is a diagram showing a processing system and explaining the principle of the scheduling method according to the present embodiment. FIG. 8 is a timing chart explaining the principle of the scheduling method. FIG. 9 shows a processing system capable of effecting batch processing, for explaining the principle of the scheduling method applied to this processing system. FIG. 10 is a timing chart representing the principle of this scheduling method.

The scheduling method is designed to prepare a schedule of performing various processes on a wafer W as the wafer W is conveyed to a plurality of processing devices, from one to another, so as to shorten the time the wafer W waits until it is processed in each processing device (except the device wherein the wafer W is processed first). Once one lot of wafers W (e.g., five wafers) has been subjected to processing, the wafers W will be conveyed to the processing device, from one to another, and will be processed in each device, virtually without waiting at any position. The throughput of wafer processing is therefore be increased.

The principle of the method will be briefly explained, with reference to FIGS. 7 and 8.

The processing system shown in FIG. 7 comprises two cassettes A and B and processing devices A and B. Each cassette contains five wafers W constituting one lot. The wafers W of the first lot supplied one after another from the first cassette A are processed one by one in the processing device A. Upon lapse of a certain time, the wafers W of the second lot sequentially supplied from the second cassette B are processed one by one in the processing device A. In the processing device A, the wafers W of the first lot may be processed under specific conditions, and the wafers W of the second lot under different conditions. In the processing device B, the wafers W of the first lot may be processed under specific conditions, and the wafers W of the second lot under different conditions. For simplicity's sake, it is assumed that, in either processing device, the wafers W of both lots are processed under the same conditions. Hence, the time the device A requires to process the wafers W conveyed from the first cassette A is equal to the time the device A requires to process the wafers W removed from the second cassette B. Similarly, the time the device B requires to process the wafers W supplied from the first cassette A is equal to the time the device B requires to process the wafers W supplied from the second cassette B.

In FIG. 8, the solid lines indicate the schedule of processing the wafers W of first lot supplied from the first cassette A; the double-line bars depict the schedule of processing the wafers W of the second lot supplied from the second cassette B; L1 indicates the period of time the device A requires to process the first lot of wafers W; and L2 indicates the period of time the device B requires to process the first lot of wafers W. Obviously, the period L2 is longer than the period L1. The period L2 does not lag behind the period L1. That is, the first wafer W of the first lot can be processed in the device B right after the last wafer W of the first lot has been processed in the device A. To put it another way, the end of the processing on the last wafer W in the device A coincides with the start of the first wafer W in the device B.

If it is scheduled that the processing device A starts processing the first wafer W of the first lot (contained in the cassette A) at time $t_{41}$ under the control of a computer, the device A will finish processing the last wafer W of the fist lot at time $t_{42}$. In this case, the device B starts processing the first wafer W of the first lot at time $t_{42}$ and finishes processing the last wafer W of the first lot at time $t_{45}$. Assume it is scheduled that the device A starts processing the first wafer of the second lot right after it has processed the last wafer W of the first lot, as indicated by a dot-and-dash line shown in FIG. 8. Then, the period the device B requires to process the wafers W of the second lot will overlap the period (L2) the device B requires to process the wafers W of the first lot over the period from time $t_{44}$ to time $t_{45}$. This overlapping of the periods means that the wafers W of the first lot must wait in front of the processing device B until the device B finishes processing all wafers W of the first lot at time $t_{45}$. This schedule is not good for the wafers W removed from the first cassette B.

In the scheduling method, the period indicated by another dot-and-dash line (FIG. 8) is shifted forward along the time axis, until the overlapping of the periods is eliminated. As a result, the device B starts processing the first wafer W of the second lot at the very time it finishes processing the last wafer W of the first lot at time $t_{44}$, as can be understood from the double-line bar shown in FIG. 8. Thus, the wafers W of either lot need not wait in front of the processing device A or B. It suffices to shift the periods indicated by the dot-and-dash lines, both by a period corresponding to the period of the longest processing. These periods having shifted, the period the device B requires to process the wafers W of the second lot would not overlap the period (L2) the device B requires to process the wafers W of the first lot.

The processing of the wafers of a third lot (not shown) can be scheduled based on the schedule of processing the wafers of the second lot in the devices A and B, in the same way as the processing of the wafers of the second lot has been scheduled on the basis of the schedule of processing the wafers of the first lot. Similarly, the processing of the wafers of any other lot can be scheduled by the method described above, based on the schedule of processing the wafers of the immediately preceding lot.

How the scheduling method can be applied in a processing system shown in FIG. 9 will be explained, with reference to the timing chart of FIG. 10 which represents the principle of the method.

As may be seen from FIG. 9, the system can process wafers W in batch, by diffusing an impurity into each wafer W and forming forming a film on the wafer W. It comprises a washing device 102, an impurity-diffusing device 104 and a film-forming device 106. The washing device 102 is provided to apply a washing solution to wafers W, thereby to remove particles, organic substances, natural oxide films and the like from the wafers W. The impurity-diffusing device 104 is designed to diffuse an impurity into the wafers W by means of thermal diffusion or the like. The film-forming device 106 is used to form films on the wafers W by means of CVD (Chemical vapor Deposition). An AGV 108 is provided between the washing device 102 and the impurity-diffusing device 104 to convey wafers W between these processing devices 102 and 104. Another AGV 110 is provided between the impurity-diffusing device 104 and the film-forming device 106 to convey wafers W between these processing devices 104 and 106. First, the 25 wafers of the first lot, removed from cassette A, are and processed in the devices 102, 104 and 103. Then, the 25 wafers of the second lot, removed from a cassette B, are processed in the devices 102, 104 and 103.

Generally, it takes about 30 minutes to wash the wafers W in the device 102, about 4 to 10 hours to diffuse an impurity into the wafers W in the device 104, and about 3 to 4 hours to form films on the wafers W in the device 106. To schedule the processing of the wafers W, the procedure of each process must be checked. Further, PERT (Program Evaluation and Review Technique) analysis must be conducted to impart a time margin to the schedule. In the PERT analysis, four factors are taken into consideration. They are: (1) the earliest time at which each process can be started (earliest start time); (2) the earliest time at which each process can be finished (earliest finish time); (3) the latest time at which each process must be started in order to complete all processes by a prescribed time (latest start time); and (4) the latest time at which each process must be finished in order to complete all processes by a prescribed time (latest finish time).

The time required to convey wafers W differs in accordance with the conditions of each process (i.e., washing, diffusion or and film-forming). It also differs in accordance with the number of wafers W forming a lot. Therefore, an empirically estimated time for processing each lot of wafers in each processing device under specific conditions is input and register, and an empirically estimated time for conveying the lot of wafers to one processing device to another is input and registered (data-inputting step). The time for processing each lot and the time for conveying the lot have been estimated from various data items acquired by operating the existing processing devices and conveying wafers by the known methods. The data items are the shortest process time, standard process time, the longest process time, the shortest convey time, standard convey time, and the longest convey time.

Next, the processing of the wafers of each lot in each processing device is scheduled, and the conveying of the wafers of each lot to each processing device is scheduled. In FIG. 10, the solid lines indicate the schedule of conveying and processing the wafers W of first lot supplied from the first cassette A (FIG. 9), and the double-line bars represent the schedule of conveying and processing the wafers W of the second lot removed from the second cassette B (FIG. 9). The longer these lines are, the longer the time of conveying and processing the wafers W.

The processing of the wafers W of either lot is scheduled so as to be started when the immediately preceding process completes, or when or after the wafers W are conveyed to the processing device. In the present embodiment, as explained above, the procedure of each process is analyzed based on four factors, i.e., the earliest start time ES, the earliest finish time ef, the latest start time ls, and the latest finish time LF. Since the earliest finish time ef of each wafer-processing or each wafer-conveying is the earliest time at which the wafers W can be conveyed to the next processing device or subjected to the next process, it is set at the earliest start time ES of the next process. Since the latest finish time LF of each wafer-processing or each wafer-conveying is the latest possible time at which the wafers W can be conveyed to the next processing device or subjected to the next process, it is set at the latest start time ls of the nest process.

Hence, as for the wafers W of the first lot, removed from the cassette A, the earliest finish time ef and latest finish time LF for washing the wafers W in the washing device 102 coincide with the earliest start time ES and latest start time is for conveying the wafers W from the washing device 102 to the next processing device (i.e., the impurity-diffusing device 104), respectively. Also, the earliest finish time ef and latest finish time LF for the conveying the wafers W from the device 102 to the device 104 coincide with the earliest start time ES and latest start time is for diffusing impurity into the wafers W in the next processing device (i.e., the impurity-diffusing device 104), respectively. Similarly, the earliest finish time ef and latest finish time LF for any next process or any next wafer-conveying coincide with the earliest start time ES and latest start time is for conveying the wafers W from the processing device to the next processing device, or for processing the wafers W in the next processing device.

This method of scheduling is also applied to the conveying and processing of the wafers W of the second lot, removed from the cassette B, thereby preparing the schedule of conveying and processing the wafers W of the second lot which is indicated by the dot-and-dash lines shown in FIG. 10. It should be noted that this schedule is an initial one, not the final schedule to be actually applied.

Thus, the schedule of conveying and processing the wafers of the first lot and the initial schedule of conveying and processing the wafers W of the second lot have been formulated.

As shown in FIG. 10, the dot-and-dash lines which depict the schedule of conveying and processing the wafers W of the second lot overlap the solid lines which indicate the schedule of conveying and processing the wafers W of the first lot. This means that the wafers W of the second lot, removed from the cassette B, must wait at the entrance to convey paths or processing devices for the periods of time which correspond to the overlapping regions of the schedules of conveying and processing the first-lot wafers W and the second-lot wafers W. The wafers W of the second lot should not be kept waiting since an oxide film may be formed on them while they remain in waiting state.

To prevent the wafers W of the second lot from waiting, the periods indicated by the dot-and-dash lines are shifted forward along the time axis, as indicated by arrow 112 shown in FIG. 10, thereby eliminating the overlapping regions of the schedule of conveying and processing the wafers W of the first lot and the schedule of conveying and processing the second-lot wafers W. The period indicated by each dot-and-dash line should be shifted by a minimum value barely enough to eliminate the overlapping region. Were the periods shifted in excess, the idling time of each processing device would increase to reduce the throughput of wafer processing.

As can be understood from FIG. 10, the periods represented by the dot-and-dash lines, i.e., the schedule of conveying and processing the wafers W of the second lot, will not overlap the periods indicated by the solid lines if they are shifted forward by the time which corresponds to the overlapping regions of the periods of diffusing an impurity into the wafers W of the first lot and the wafers W of the second lot. Therefore, the periods represented by the dot-and-dash lines are so shifted, eliminating all overlapping regions of the conveying/processing schedule for the wafers of the first lot and the initial conveying/processing schedule for the wafers W of the second lot. As a result of this, a final schedule of conveying and processing the wafers W of the second lot is prepared, which is indicated by the double-line bars shown in FIG. 10.

In accordance with the conveying/processing schedule for the wafers W of the first lot and the final conveying/processing schedule for the wafers W of the second lot, the computer incorporated in the processing system (FIG. 9) generates instructions and supplies them to the processing devices 102, 104 and 106 and the AGVs 108 and 110. Then, the washing device 102 starts washing the wafers W of the first lot at time $t_{41}$, the AGV 108 conveys the wafers W from the washing device 102 to the impurity-diffusing device 104, the device 104 diffuses the impurity into the wafers W, the AGV 110 conveys the wafers W from the device 104 to the film-forming device 106, and the device 106 forms films on the wafers W.

While the impurity-diffusing device 104 is diffusing the impurity into the wafers W of the first lot, the washing device 102 starts washing the wafers W of the second lot at time $t_{42}$. Thereafter, the device 104 diffuses the impurity into the wafers W of the second lot, and the device 106 forms films on the wafers W of the second lot. Since the conveying/processing schedule for the wafers W of the first lot and the conveying/processing schedule for the wafers W of the second lot do not overlap at any region, the wafers W of the second lot are smoothly conveyed and processed, not kept waiting at the entrance to the washing device 102, the impurity-diffusing device 104 or the film-forming device 106. The time for conveying the wafers W from one processing device into the next processing device can therefore be shortened as much as possible. Forming of natural oxide films on the wafers W can thereby suppressed greatly, and the throughput of wafer processing is sufficiently high.

Although only two wafer cassettes A and B are shown in FIG. 9, far more wafer cassettes, each containing a lot of wafers W, are brought to the processing system. The conveying and processing of of the wafers W of any lot and the conveying and processing of the wafers W of the next lot are scheduled in the same method as described above. The conditions of processing the wafers of one lot in a processing device may differ from those of processing the wafers of any other lot in the same processing device. In this regard it should be noted that the control system incorporated in the processing system keeps measuring the time spent in processing the wafers W of every lot under any conditions, and also the time consumed in conveying them from one processing device to another. Of the periods actually used in processing, for example, five consecutive lots of wafers under the same conditions, the shortest process time, the standard (average) process time and the longest process time are obtained. The data items showing these are input and registered, and the previously registered data, each representing the empirically estimated time for processing each lot of wafers in one processing device under specific conditions, are erased. Namely, the data is updated.

In accordance with the data updated, the conveying/processing schedule for the wafers of each lot and the initial conveying/processing schedule for the wafers of the next lot are formulated, and then the final conveying/processing schedule for the wafers of the next lot is formulated. Thus, the conveying and processing of the wafers W of any two consecutive lots can be scheduled dynamically. Therefore, the processing system can process wafers W at high efficiency.

A scheduling system and a scheduling method, both according to the second embodiment, will be described in greater detail, with reference to FIGS. 11 to 18.

Figure 11:
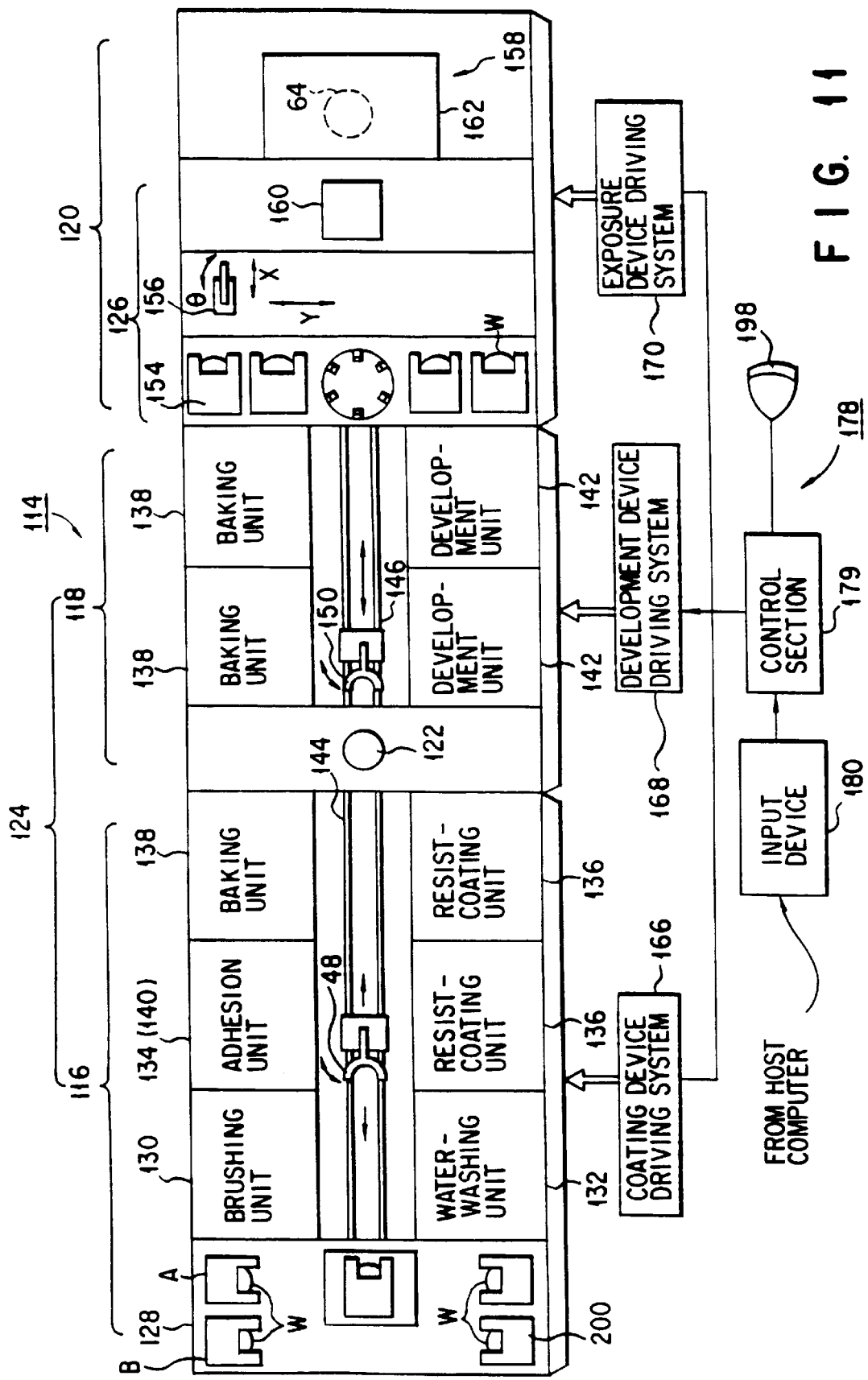
FIG. 11 is a plan view of a processing system incorporating a scheduling system according to the present invention.

FIG. 11 illustrates a processing system 114 incorporating the scheduling system, and FIG. 12 shows how objects are conveyed in the processing system.

The processing system 114 is designed to coat resist on an object such as a wafer, forming a resist film on the wafer, apply an electron beam to the wafer, thereby drawing a circuit pattern on the resist film, and develop the resist film. The system 114 comprises a coating device 116 for coating wafers W with resist sensitive to an electron beam, a development device 118 for developing the wafers W exposed to light, and an electron-beam exposure device 120 for applying an electron beam to the wafers, thus exposing them to light. The system 114 further comprises a waiting table 122 interposed between the coating device 116 and the development device 118. The devices 116 and 118 and the waiting table 122 constitute a coating/development section 124. The electron-beam exposure device 120 has a convey mechanism 126 which is designed to receive wafers W from the development device 118 and convey them thereto.

The coating/development section 124 comprises a loader unit 128, a brushing unit 130, a water-washing unit 132, an adhesion unit 134, resist-coating units 136, baking units 138, a cooling unit 140, and development units 142. The loader unit 128 is provided for loading and unloading wafers W. The brushing unit 130 is designed to brush wafers W to clean them. The water-washing unit 132 applies a jet of water onto wafers W to wash them. The adhesion unit 134 is used to render the surfaces of a wafer W hydrophobic. The resist-coating units 136 are provided for coating resist on the surface of a wafer W and remove excessive resist from the circumference of the wafer W. The baking units 138 are used to heat wafers W before resist is coated on them, thus performing pre-baking, and also to heat the wafers W after the resist is coated on them, accomplishing post-baking. The cooling unit 140 is located below the adhesion unit 134, for cooling wafers W to a predetermined temperature. The development units 142 are designed to develop wafers W which has been exposed to light in the electron-beam exposure device 120, and to rinse the resist patterns formed on the wafers by means of development.

Two main convey paths 144 an 146 extend along the center line of the coating/development section 124, axially aligned with each other and spaced from each other. Two main convey arms 148 and 150 are provided, movable along the main convey paths 144 and 146, respectively. The processing units 130, 134, 138 and 140 are arranged on one side of the main convey paths 144 and 146, while the other processing units 132, 136 and 142 are arranged on the other side of the paths 144 and 146. It is between the main convey paths 144 and 146 that the waiting table 122 is provided to transfer wafers W between the main convey arms 148 and 150.

The convey mechanism 126 of the electron-beam exposure device 120 located adjacent to the coating/development section 124 has an intermediate table 152, buffer cassettes 154, a convey arm 156, an electron-beam exposure unit 158, and a wafer table 160. The intermediate table 152 opposes an end of the main convey path 146 and can move up and down. Some of the buffer cassettes 154 are arranged on one side of the intermediate table 152, and the other buffer cassettes 154 on the other side of the table 152. The convey arm 156 is located in front of the intermediate table 152; it can move in X-axis and Y-axis direction (in a horizontal plane) and Z-axis direction (in vertical direction) and can rotate in the direction of arrow θ. The electron-beam exposure device 120 further has an electron-beam exposure unit 158 connected to the convey mechanism 126. It is on the exposure unit 158 that the wafer table 160 is mounted. The exposure unit 158 has a vacuum chamber 162 and an electron gun 164. The chamber 162 is provided for containing a wafer Which is to be processed. The electron gun 164 is used to apply an electron beam on to the wafer contained in the vacuum chamber 162.

As shown in FIG. 11, the processing system 114 further comprises a coating-unit driving system 166, an exposure device driving system 168 and an electron-gun driving system 170. As clearly seen from FIG. 12, the coating-unit driving system 166 is used to drive the coating section 172 witch incorporates the coating device 116, the development-unit driving system 168 is provided to drive the development section 174 which has the development device 118, and the exposure device driving system 170 is used to drive the electron-beam applying section 176 which incorporates the electron gun 164.

More specifically, the coating-unit driving system 166 drives drives all processing units and convey means of the coating device 116—namely the main convey arm 48 which loads wafers W, the units 130 and 132 which wash them, the unit 134 which renders their surfaces hydrophobic, the unit 138 which heats them, the unit 140 which cools them, and the units 136 which coat resist on them. The development-unit driving system 168 drives all processing units and convey means of the development section 174—namely the main covey arm 150 which conveys wafers W, the baking units 138 which heat them, and the development units 142 which develop them. The exposure device driving system 170 drives the movable components and the electron gun which are incorporated in the electron-beam applying section 176.

As shown in FIG. 11, the processing system has a scheduling device 178 which generates instructions. The instructions are supplied to the driving systems 166, 168 and 170. The driving systems 166, 168 and 170 operate in accordance with the instructions. The scheduling device 178 has a control section 179, an input device 180 and a display 198.

The input device 180 is operated to input data representing the periods during which the components of the coating device 116, the development device 118 and the electron-beam exposure device 120 are to be operated to convey a predetermined number of wafers and to process them under specific conditions.

As seen from FIG. 12, the control section 179 has microcomputers and the like. More specifically, it comprises a data memory 182, a first scheduling unit 184, a second scheduling unit 186, an instruction generator 188, a re-schedule instruction generator 190, two RAMs 192 and 194. The data memory 182 is, for example, a RAM for storing the data input by operating the input device 180. The first scheduling unit 184 prepares, based on the data stored in the memory 182, an initial schedule of conveying and processing the wafers in a pipeline scheme such that each processing unit starts processing the wafers at the same time or some time after the preceding processing unit finishes processing them. The second scheduling unit 186 compares the periods of processing the wafers of any consecutive lots in the same processing unit, said periods specified in the initial schedule, and shifts the period of processing the wafers of the second of the consecutive lots, forward along the time axis until the overlapping, if any, of the periods compared is eliminated, thereby preparing a final schedule, and supplies the final schedule to the instruction generator 188. The instruction generator 188 generates drive instructions from the final schedule and supply the instructions to the driving systems 166, 168 and 170. The re-schedule instruction generator 190 updates the data stored in the memory 182 in accordance with the periods during which the processing units have processed wafers, generates re-schedule instructions, and supplying these instructions to both scheduling units 184 and 186, instructing the unit 184 to prepare a new initial schedule based on the updated data and the unit 186 to prepare a new final schedule based on the new initial schedule.

The RAMs 192 and 194 are connected to the first scheduling unit 184 and the second scheduling unit 186, respectively. A timer 196 is connected to the re-schedule instruction generator 190. The display 198 is connected to the output of the second scheduling unit 186, for displaying the final schedule for convenience of an operator.

Figure 13:
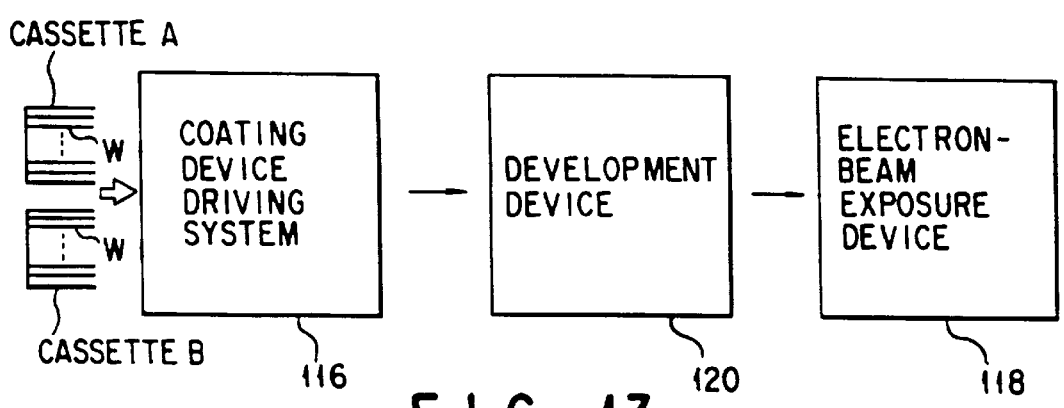
FIG. 13 is a diagram illustrating how a lot of objects are conveyed in the processing system shown in FIG. 11.

In the processing system shown in FIG. 11, the wafers W of each lot, removed from a cassette (a cassette A or a cassette B) as shown in FIG. 13, are washed, dried, coated with resist and baked in the coating device 116. The wafers W are conveyed to the electron-beam exposure device 120. In the device 120, an electron beam is applied to each wafer W, drawing a circuit pattern on the wafer W. Thereafter, the wafers W are conveyed to the development device 118 and developed in this device 118.

How the processing system shown in FIG. 11 is operated will be described, thereby to explain in detail the scheduling method according to the second embodiment.

First, it will be explained how wafers W are conveyed in the system. Two cassettes A and B, each containing five wafers W which form one lot, are provided. The five wafers W removed from in either cassette are first processed in the coating device 116, then in the electron-beam exposure device 120, and finally in the development device 118. The number of wafers forming one lot is not limited to five. Rather, it can be 10, 15 or any desired number. Furthermore, the lots may differ in terms of the number of wafers W.

The five wafers of the first lot, removed from the cassette A, are continuously processed in a processing unit. Upon lapse of a predetermined time, the five wafers W of the second lot are continuously processed in the same processing unit. The wafers W of a third lot, if any, are then continuously processed in the same processing device upon lapse of the predetermined time from the end of the processing of the first lot. The wafer W of each lot are processed under the same condition. Nonetheless, the conditions of processing the wafers W of one lot differ from those under which the wafers of another lot are processed in the same processing unit.

First, the main convey arm 148 conveys the from the cassette A or the cassette B containing the wafers W first to the unit 130, then to the unit 132, hence to the unit 134, further to the units 136, the unit 138 and then to the unit 140. The wafers W are thereby coated with resist. The main convey arm 148 conveys the wafers W onto the waiting table 122. Next, the main convey arm 150 holds the wafers W and conveys them onto the intermediate table 152 of the convey mechanism 126. If necessary, the wafers W are cooled while mounted on the table 152. Then, the main convey arm 150 holds the wafers W and convey them from the table 152 onto the wafer table 160.

Thereafter, the convey mechanism (not shown) incorporated in the electron-beam exposure unit 15B conveys the wafers W into the vacuum chamber 162. The electron gun 164 applies an electron beam onto each of the wafers W now contained in the vacuum chamber 162. The wafers W thus exposed to light are conveyed from the electron-beam exposure device 120 back to the coating/development section 124. More precisely, they are first mounted on the wafer table 160, the convey arm 156 receives the wafers W and conveys them onto the intermediate table 152.

The main convey arm 150 holds the wafers W and conveys them to the development units 142. The units 142 develop the wafers W, which are transferred to the main convey arm 148. The arm 148 conveys the wafers W to the loader unit 128. In the unit 128, the wafers W are loaded into one of the cassettes 200 which are provided for containing processed wafers. The timing of conveying the wafers W to and from the coating/development section 124 and the timing of conveying the wafers W to and from the electron-beam exposure unit 158 may differ greatly from each other. If this is the case, the wafers W are temporarily held within one of the buffer cassettes 154.

With reference to the flow chart of FIG. 14 and the schedule charts of FIGS. 15 to 17, it will be explained how the processing system schedules the processing of wafers W.

First, the operator or an AGV places the cassettes A and B, each containing a lot of unprocessed wafers W, on the loader unit 128 of the coating device 116 (Step S1). Then, the operator operates the input device 180, thereby inputting the data representing the conditions and periods of processing the wafers W in various ways (Step S2). Alternately, the data may be supplied to the input device 180 from a host computer or the like through a communication line. The data is stored into the data memory 182 (Step S3).

The items of the data stored into the data memory 182 are as follows:
a) Process in the coating device 116
 a1) Condition 1 (for five wafers)
  Shortest process time: 6 minutes
  Standard process time: 7 minutes
  Longest process time: 8 minutes
b) Process in the exposure device 120
 b1) Condition 1 (for one wafer)
  Shortest process time: 20 minutes
  Standard process time: 21 minutes
  Longest process time: 22 minutes
c) Process in the development device 118
 c1) Condition 1 (for five wafers)
  Shortest process time: 8 minutes
  Standard process time: 9 minutes
  Longest process time: 10 minutes Each process time is one which has been estimated from various data items acquired by operating the existing processing devices and conveying wafers by the known methods. In the present embodiment, the electron-beam exposure device 120 may be replaced by a so-called stepper, i.e., an optical apparatus which reduces the circuit pattern defined by a mask and transfers the reduced pattern onto a wafer. If so, it is necessary to examine the wafer for dust from the mask (i.e., reticle). If the process conditions and the number of wafers forming a lot are changed to others, it will be, of course, necessary to input the process periods which correspond to the other conditions and the other number of wafers.

The first scheduling unit 184 performs PERT analysis on the data now stored in the data memory 182 (i.e., the shortest process time, the standard process time and the longest process time) so that each processing device may continuously process wafers of each lot with a time margin. To be more specific, the first scheduling unit 184 determines the earliest start time (ES), the earliest finish time (ef), the latest start time (ls) and the latest finish time (LF) for each lot of wafers, thus preparing a schedule of processing the wafers of each lot (Step S4).

The unit 184 combines the schedules of processing all lots of wafers, thereby preparing an initial schedule (Step S5). In Step S5, the schedule of processing one lot is not adjusted with respect to the schedule of processing any other lot. The data representing the initial schedule, thus prepared, is stored into the RAM 192 in the form of a table, as illustrated in FIG. 15.

Figure 16:
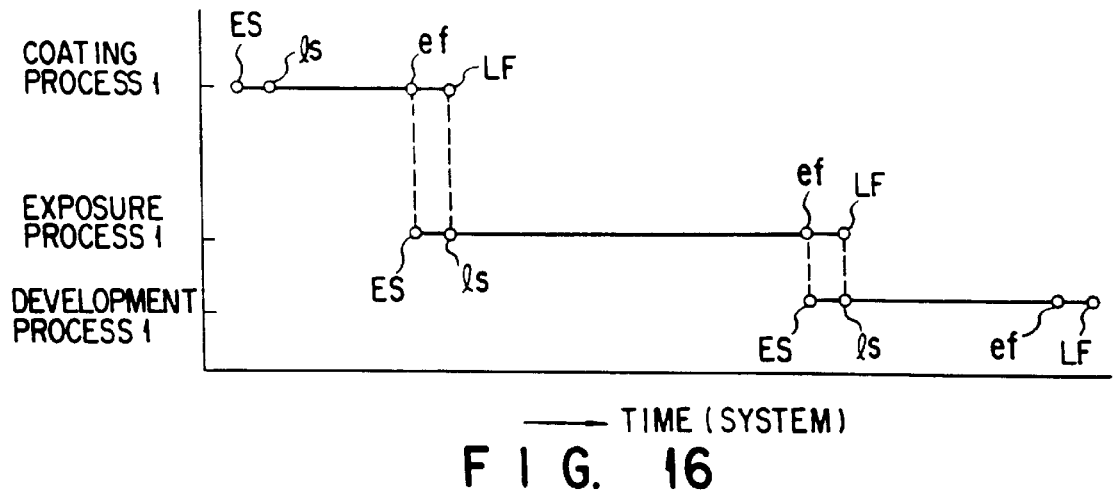
FIG. 16 is a schedule chart explaining how the first lot of objects are conveyed in the system shown in FIG. 11.
Figure 17:
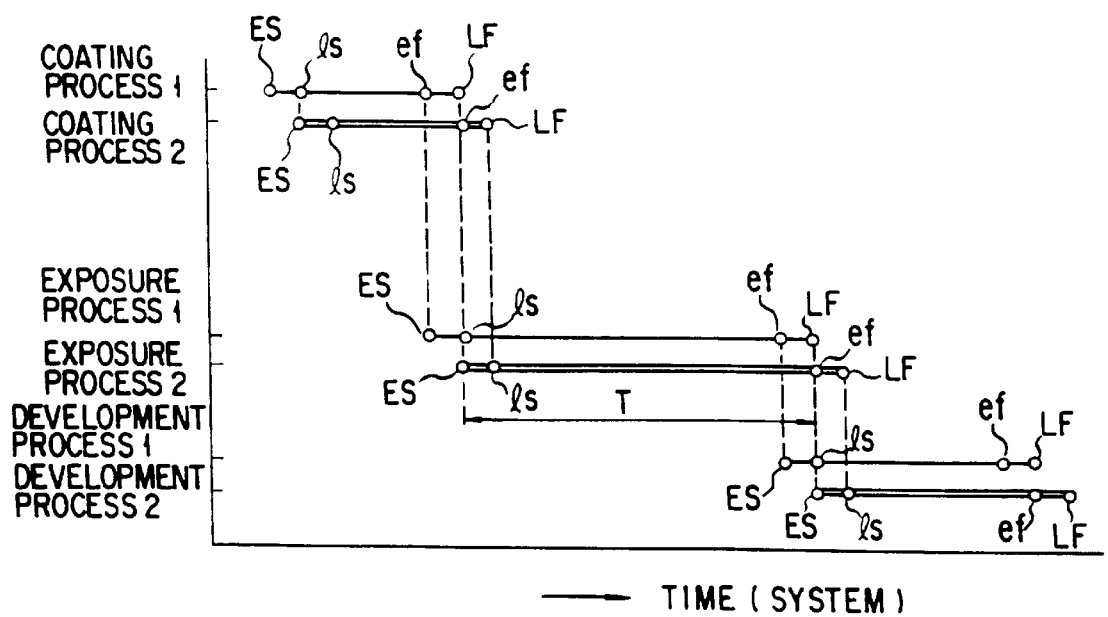
FIG. 17 is a schedule chart explaining how two consecutive lots of objects are conveyed in the system shown in FIG. 11.

FIG. 16 is a schedule chart explaining how the wafers of the first lot removed from the cassette A are conveyed in the processing system, and FIG. 17 is a schedule chart explaining how the wafers of the first lot and those of the second lot removed from the cassette B are conveyed in the processing system. In FIGS. 16 and 17, the solid lines indicate the schedule of processing the wafers of the first lot 1 (removed from the cassette A), whereas the double-line bars represent the schedule if processing the wafers of the second lot 2 (removed from the cassette B).

In scheduling the processing of the wafers of either lot, the earliest finish time ef of any process is the closest to the start of the next process as has been explained with reference to FIG. 10. This is because any process should not be passed in pipeline scheme. The earliest start time ES of the next process is therefore made to coincide with the earliest finish time ef of the process. Similarly, the latest start time ls of the next process is made to coincide with the latest finish time LF of the process since the time LF is the farthest from to the start of the next process.

Hence, as shown in FIG. 16, the earliest finish time ef and the latest finish time LF for the resist-coating process 1 of the wafers removed from the cassette A coincide with the earliest start time ES and latest start time ls for the next process of the wafers, i.e., the light-exposure process 1, respectively. Further, the earliest start time ES and the latest start time is for the light-exposure process 1 coincide with the earliest start time ES and latest start time is for the next process of the wafers, i.e., the development process, respectively. Although not shown in FIG. 16, the processing of the wafers removed from the cassette B is scheduled in the same way.

As can be understood from FIG. 17, the earliest start time at which ES of the resist-coating process 2 on the wafers removed from the cassette B is made to coincide with the latest start time is of the resist-coating process 1 on the wafers removed from the cassette A, thereby making an initial process schedule of processing the wafers removed from the cassette B. The light-exposure process and the development process to be performed on both lots of wafers are scheduled in the same way as the resist-coating process. Thus, each process is scheduled such that the earliest start time of the process on the wafers of a lot coincides with the latest start time of the process on the wafers of the preceding lot. Here ends Step S5, i.e., the preparation of the initial schedule.

As evident from FIG. 17, the periods of various processes on the wafers removed from the cassette B in various overlap the period of the processes on the wafers removed from the cassette A. This means that the wafers removed from the cassette B must wait at the entrance to each processing device. The wafers W of the second lot should not be kept waiting since the resist films coated on them become less sensitive to an electron beam or light.

To prevent the wafers (removed from the cassette B) from remaining at the entrance to the processing device, the second scheduling unit 186 compares the periods indicated by the dot-and-dash lines with the periods indicated by the solid lines (Step S6). Then, the unit 186 shifts the periods indicated by the dot-and-dash lines forward along the time axis, as indicated by arrow 202 in FIG. 18 (Step S7). As a result, the overlapping regions of the schedule of processing the wafers and the schedule of processing the wafers removed from the cassette A are eliminated.

The period indicated by each dot-and-dash line should be shifted by a minimum value barely enough to eliminate the overlapping region. Were the periods shifted in excess, the idling time of each processing device would increase to reduce the throughput of wafer processing. As can be seen from FIGS. 17 and 18, that minimum shift value is the period T (FIG. 17) between the latest start time ls and latest finish time LF of the light-exposure process on the wafers removed from the cassette A, which is the longest process.

This period-shifting is effected on the following relationship among the processes on the wafers of two consecutive lots:

1) Exposure process 1 and development process 1

$$ef1 \leq ES1$$

2) Exposure process 1 and development process 2

$$lf1 \leq ES2$$

3) Exposure process 1 and development process 2

$$lf1 \leq ES2$$

4) Exposure process 1 and development process 2

$$lF1 \leq ES2$$

In the case where a stepper is employed in place of the electron-beam exposure device 120, the wafers must be inspected for dust from the mask (i.e., reticle) before the light is applied to the wafers. The relation between the dust inspection 1 and the exposure process 1 is: LF1≦ES1, and the relation between the dust inspection 1 and the dust inspection 2 is: LF1≦ES2.

The period-shifting has been described with reference to two consecutive lots of wafers. Nevertheless, period-shifting is performed also on the wafers of any other two consecutive lots, whereby the second scheduling unit 186 prepare a final schedule of processing the wafers of all lots (Step S8). The final schedule is stored into the RAM 194 (Step S9).

Figure 18:
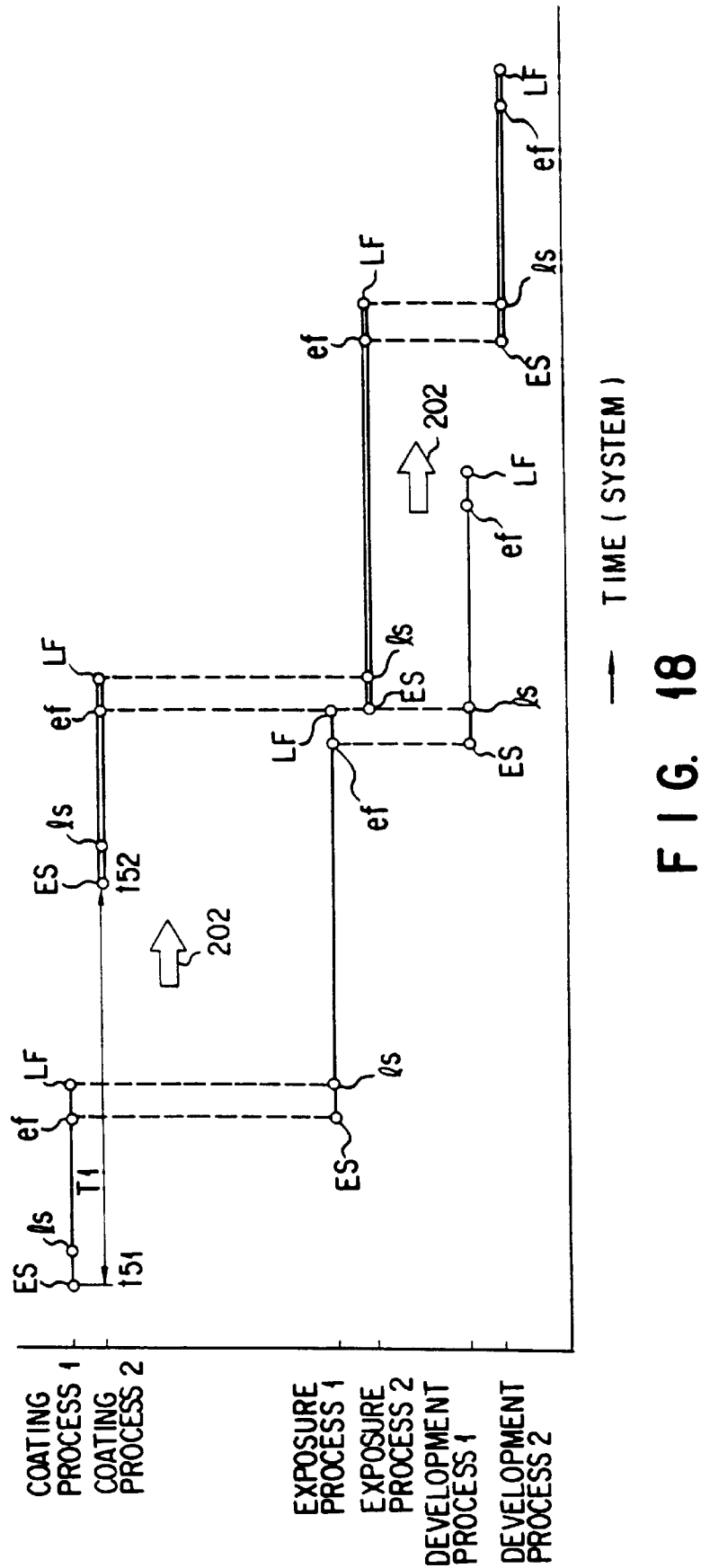
FIG. 18 is a diagram representing an initial schedule of processing two consecutive lots of objects in the system of FIG. 11.

The processes are performed on the wafers in accordance with the final schedule thus prepared. As shown in FIG. 18, the resist-coating process 1 on the wafers removed from the cassette A is started at time $t_{s1}$, and the resist-coating process 2 on the wafers removed from the cassette A is started at time $t_{s2}$, delayed by period T1. At time $t_{s2}$, the light-exposure process 1 is being performed on the wafers removed from the cassette A. Meanwhile, the data representing the final schedule is supplied to the display 198, which displays the final schedule for convenience of an operator.

The data representing the final schedule is supplied also to the instruction generator 188. The generator 188 generates drive instructions from the final schedule and supply the instructions to the coating-unit driving system 166, the development-unit driving system 168, and the exposure device driving system 170. Wafers are therefore conveyed to the coating device 116 and coated with resist. Then, they are conveyed to the development device 118 and developed thereby. Finally, they are conveyed to the electron-beam exposure device 120 and applied with an electron beam (Step S10).

As mentioned above, many lots of wafers are continuously processed, lot by lot, in accordance with the final schedule, though only two lots of wafers are shown in FIG. 13. The timer 196 measures the time actually spent to perform each process on the wafers of each lot (Step S11). Then, of periods actually used in processing, for example, five consecutive lots of wafers under the same conditions, the shortest process time, the standard process time and the longest process time are obtained (Step S12). The data items showing these are stored into the data memory 182, thereby updating the data (Step S13). The re-schedule instruction generator 190 generates re-schedule instructions and supplies them to both scheduling units 184 and 186, instructing the unit 184 to prepare a new initial schedule based on the updated data and the unit 186 to prepare a new final schedule based on the new initial schedule (Step S14).

The new final schedule is formulated by hastening a process on the wafers of each lot if the time spent to complete the same process on the wafers of the preceding lot completes is shorter than an empirically estimated time, or by delaying the process if the time used to complete the same process on the wafers of the preceding lot is longer than the empirically estimated time. More precisely, if it takes 10 minutes longer than scheduled to finish the washing process 1 on the wafers of a lot, the period for the washing process 1 is increased by 10 minutes, and the washing process 2 on the wafers of the next lot is delayed by 10 minutes.

In practice, the final schedule prepared by the second scheduling unit 186 is more complicated than the one illustrated in FIG. 18. Therefore, the re-scheduling may be performed when a time longer than scheduled has been used to finish any process, not when a time shorter than scheduled has been spent to finish the process.

As described above, the final schedule is formulated such that the period for the process on the wafers of any lot under a specific condition may not overlap the period for the same process on the wafers of the preceding lot, and the processing devices are operated in accordance with the final schedule thus formulated. As a result, no wafers of any lot will not remain in waiting state at the entrance to any processing device. That is, once the processing system comes into operation, the wafers of any lot are smoothly and continuously processed, without being held at any position in the processing system. Each wafer after coated with resist is not be kept waiting before subject to an exposure process or a development process. The resist films formed on it is therefore prevented from becoming less sensitive to an electron beam or light.

As described above, the data stored in data memory 182, which represent the input periods for processing each lot of wafers in various processing devices under specific conditions, is updated by the periods of time measured to have been actually spent to process the wafers in the processing devices under those conditions. Further, the final schedule is changed based on the data thus updated. It follows that the wafers of any lot can be continuously conveyed and processed even if the periods actually spent to process the wafers greatly differ from the input periods for processing them.

The second embodiment of the invention is applied to a processing system which washes wafers, diffuses an impurity into them, form a film on them, coating resist on them, applies light onto them and develop them. Nonetheless, the present invention is not limited to such a processing system. Rather, the invention can be applied to any other type of a processing system. For instance, a sequence of steps of applying light onto the resist films formed on wafers, post-baking the wafers and developing the wafers may be scheduled so as to reduce the time required for each step. Moreover, the objects processed are not limited to semiconductor wafers; they may be LCD substrates, glass substrates, and the like.

In the scheduling method and the scheduling system, both according to the second embodiment, empirically estimated periods required to process objects in various processing device under specific conditions is input into the data memory, and the processing of the objects of at least two consecutive lots is scheduled based on the estimated periods such that the period for processing the second-lot objects in each processing device is prevented from overlapping the period for processing the first-lot objects in the same processing device. Therefore, the objects of any lot is not kept waiting at the entrance to each processing device. Once the processing of the objects is started, the objects are processed in all processing devices, without being held at any position in the processing system. Forming of natural oxide film on each object and a decrease in the light-sensitivity of the resist film formed on each object can be suppressed greatly. This helps to enhance the yield of the products made by processing the objects.

The data initially stored into the data memory, which represents the empirically estimated periods for processing the objects in various processing devices under specific conditions, are replaced by the data showing the actually measured periods for the objects in the devices under those conditions. The objects of any lot can be continuously conveyed and processed even if the periods actually spent to process the objects greatly differ from the periods initially stored into the data memory.

Embodiment 3

The third embodiment of the invention provides a processing method and a processing system, which can schedule the processing of a plurality of objects.

The processing system comprises a container-supporting section for supporting a plurality of containers each capable of containing a plurality of objects; processing means for performing a desired process on objects, one by one; driving systems for driving the processing means; conveying means for conveying objects between the container-supporting section and the processing means; input means for inputting first-type data items representing the conditions of processing objects and second-type data items associated with the first-type data items and specifying the containers; first storage means for storing the first- and second-type data items input from the input means; grouping/scheduling means for reading the first- and second-type data items stored in the first storage means, dividing the objects into groups in accordance with the conditions of processing objects and preparing a schedule of processing the objects; second storage means for storing the schedule prepared by the grouping/scheduling means; and process instruction generating means for reading the schedule from the second storage unit, generating process instructions based on the schedule and supplying the process instructions to the driving systems, thereby to drive the processing means.

The grouping/scheduling means schedules the processing of objects such that the objects to be processed under the same condition are sequentially processed and that those of the objects contained in each container which are to be processed under a few conditions are processed before those to be processed under more conditions. When new containers, each containing objects, are mounted on the container-supporting section, the grouping/scheduling means reads the first- and second-type data items stored in the first storage means and prepare a new schedule based on the data.

The processing method according to the third embodiment is will now be described.

When containers each containing a plurality of objects, are placed on the container-supporting section, the input means inputs first- and second-type data items defined above. These data items are stored into the first storage means. The grouping/scheduling means reads the data items from the first storage means and processes the data items, thereby dividing the objects into groups. Further, the grouping/scheduling means prepare a schedule that the groups of objects should be processed in a particular order. Thus, the objects to be processed under the same conditions will be processed one after another, even if they are contained in different containers. The schedule is stored into the second storage means.

In accordance with the schedule stored in the second storage means, the process instruction generating means generates process instructions and supplies the process instructions to the driving systems. The conveying means is thereby driven, conveying objects to the processing means. The processing means starts processing the objects. Objects to be processed under the same conditions are processed continuously, one after another, even if they have been contained in different containers. After these objects have been processed, the process conditions are changed to new ones under which other objects are to be processed. For example, the ion source is changed to a new one in the case of ion implantation, and the beam pattern is changed to another in the case of electron-beam exposure. When the processing means is rendered able to process the other objects under the new conditions, it starts processing them.

Since the objects of any group, which should be processed under the same conditions, are sequentially processed without a break, the operation is suspended less frequently than otherwise. This serves to increase the throughput of processing the objects.

Of the objects contained in each container, those to be processed under a few conditions may be processed before those to be processed under more conditions. Then, the container will be emptied more quickly than otherwise, and the next container containing unprocessed objects can be mounted on the container-supporting section earlier than otherwise.

As soon as the next container is set on the container-supporting section, the grouping/scheduling means reads the data items stored in the first storage means and representing the conditions under which to process the objects contained in this container, and prepares a new schedule based on these data items. If some of the objects contained in the next container need to be processed under the same conditions as those removed from the preceding container and which are being processed, they will be processed before the objects still contained in the preceding container. This reduce the frequency at which process conditions should be switched.

The processing method and the processing system, both according to the third embodiment, will now be described in greater detail, with reference to FIG. 19 to 29.

Figure 19:
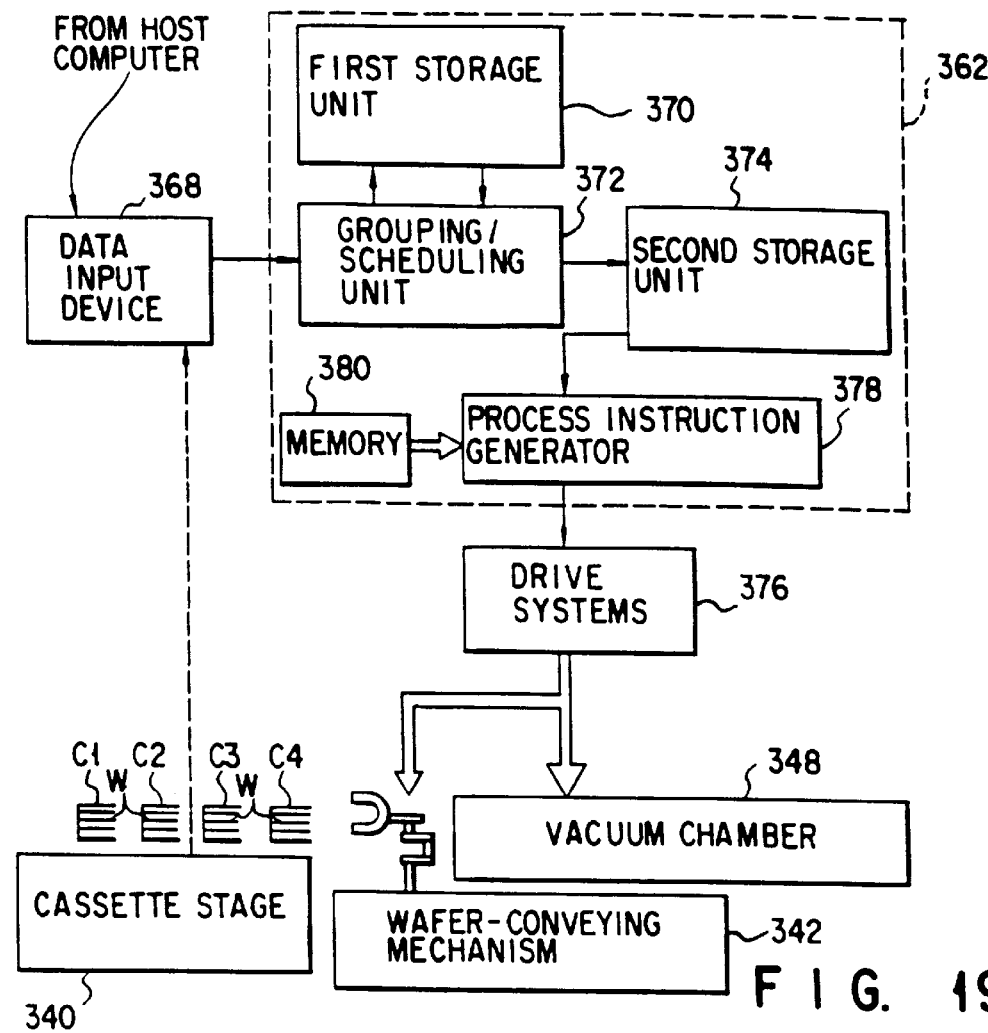
FIG. 19 is a block diagram showing a part of a processing system according to a third embodiment of the present invention.
Figure 21:
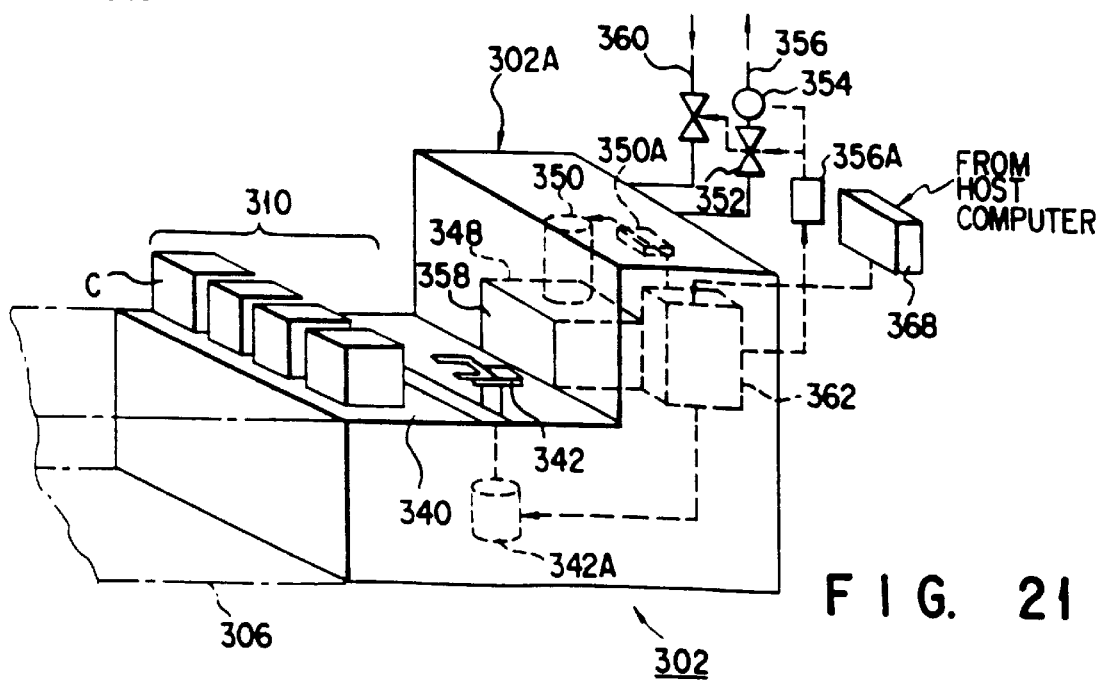
FIG. 21 is a perspective view of the system shown in FIG. 20.
Figure 22:
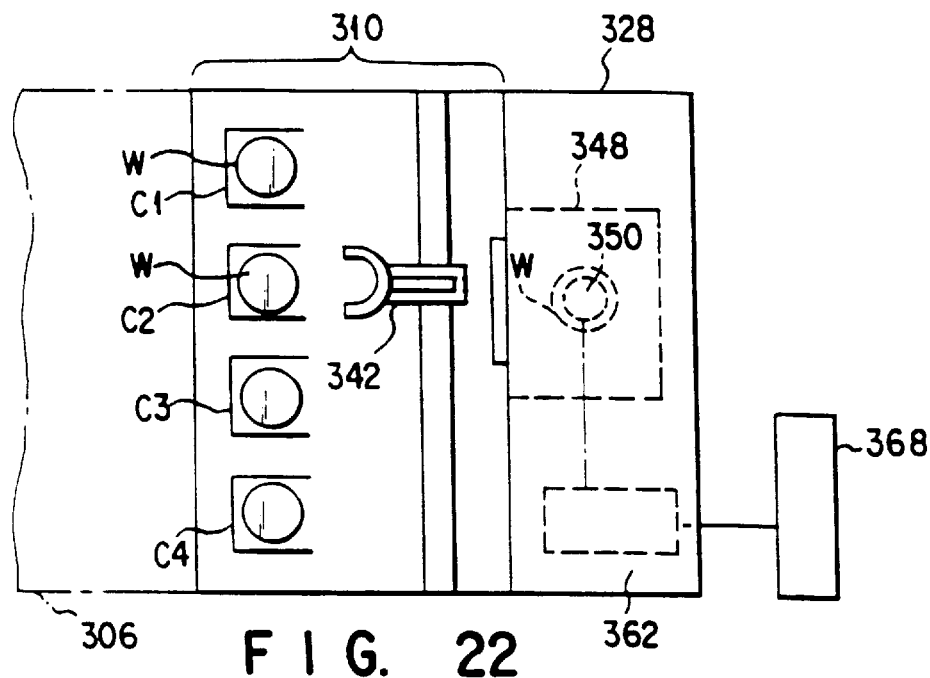
FIG. 22 is a plan view of a processing device incorporated in the system of FIG. 20.
Figure 23:
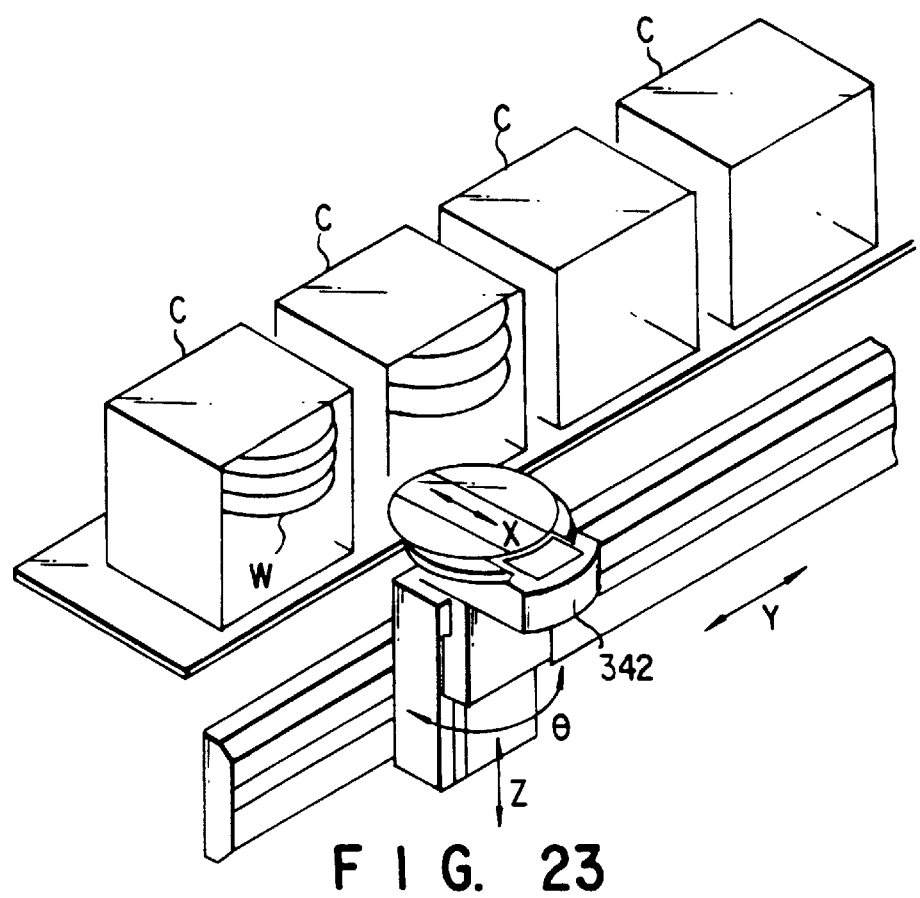
FIG. 23 is a perspective view of the object-conveying means used in the system of FIG. 20.
Figure 28:
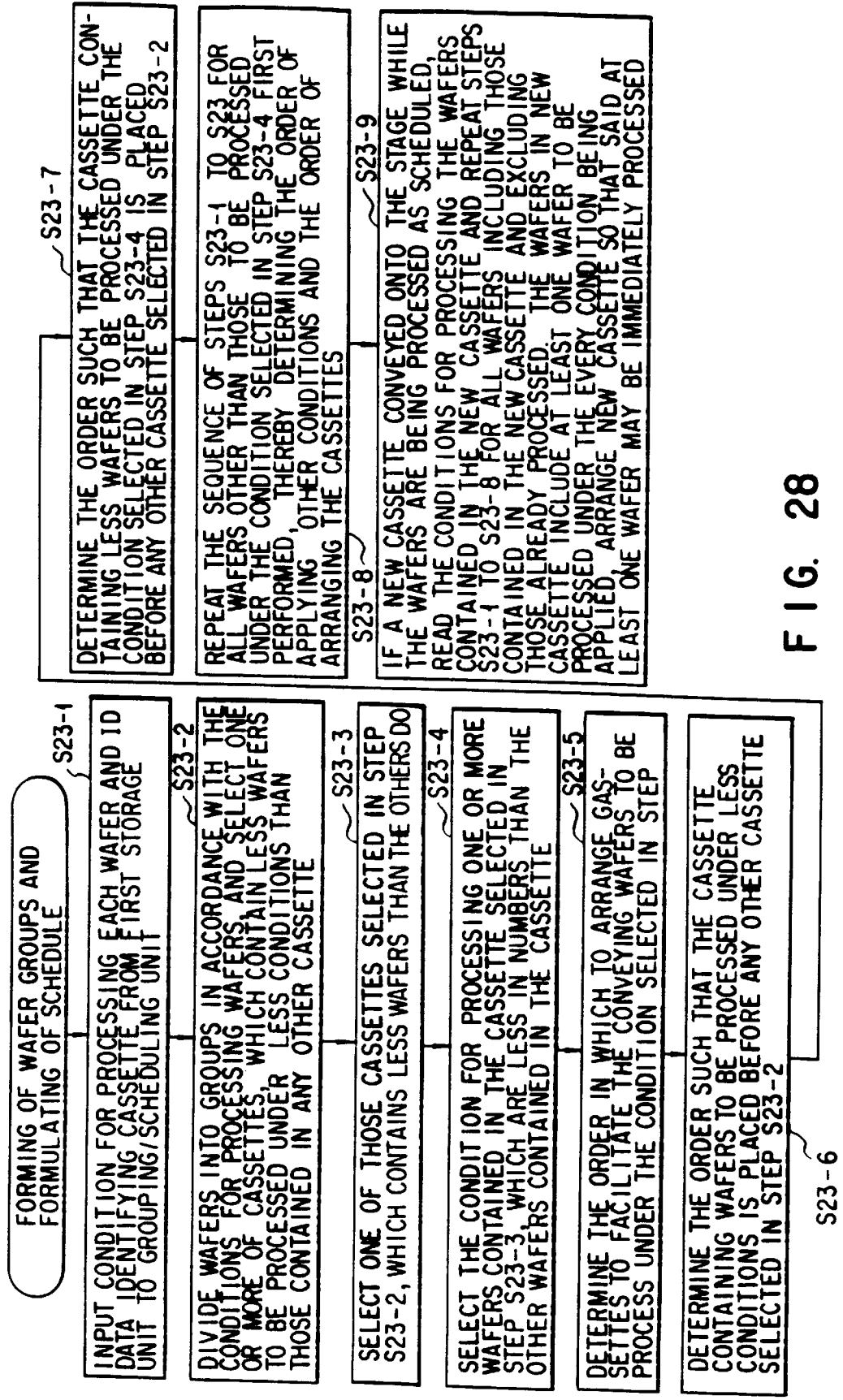
Figure 29:
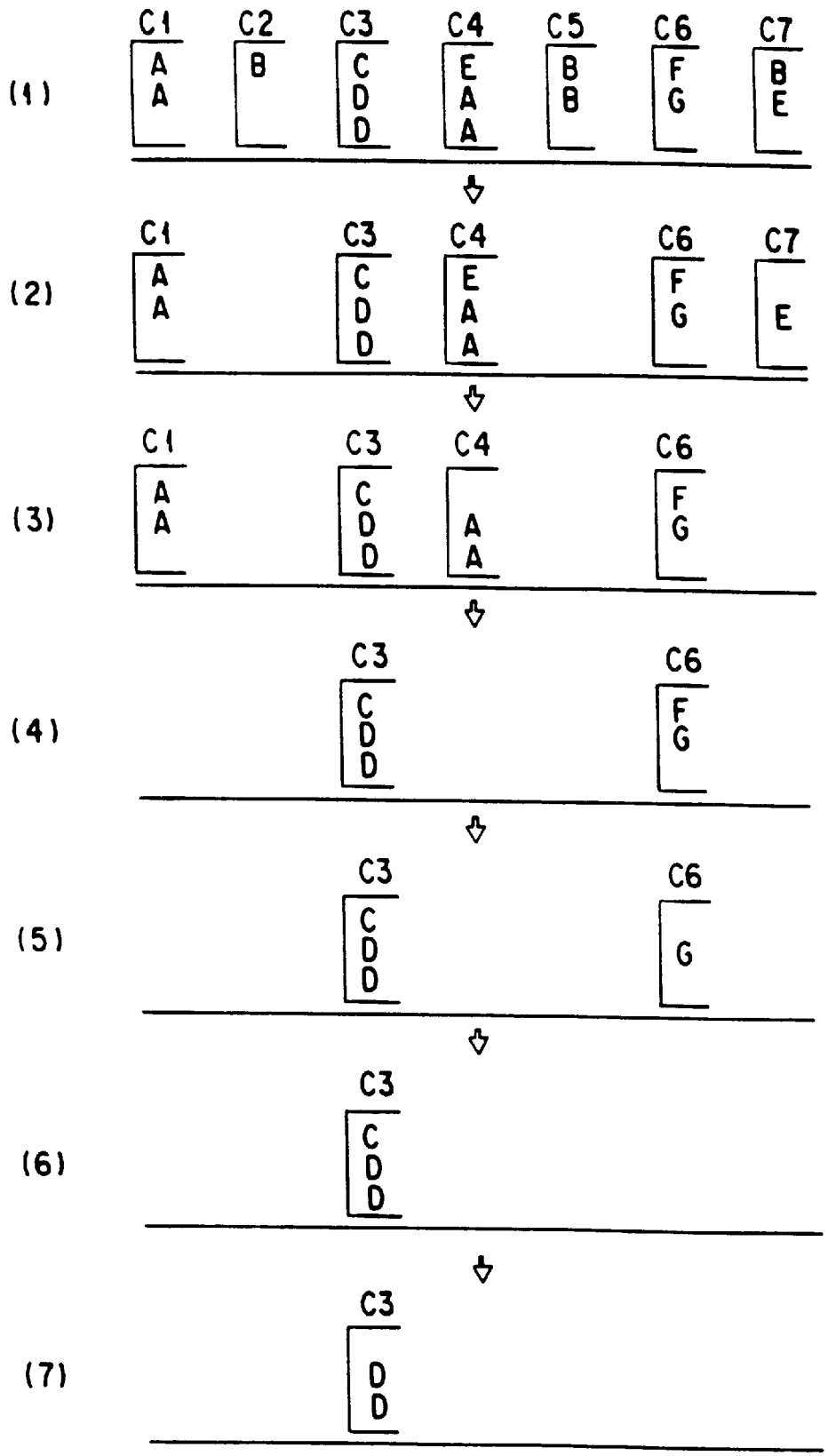
FIG. 29 is a diagram illustrating how the containers are moved to form groups of objects and prepare the schedule.

FIG. 19 is a block diagram showing a part of the processing system, FIG. 20 is a plan view of the processing system, FIG. 21 is a perspective view of the system, FIG. 22 is a plan view of a processing device incorporated in the system, and FIG. 23 is a perspective view of the object-conveying unit used in the processing system.

As shown in FIG. 20, the processing system 304 comprises two main components, i.e., a electron-beam exposure device 302 and a coating/development device 306.

The device 302 is designed to apply an electron beam onto the resist film formed on a semiconductor wafer (i.e., an object), thereby to form a circuit pattern on the wafer. The device 302 comprises an electron-beam exposure unit 302A and a wafer-conveying unit 310. The unit 302A is provided for applying an electron beam onto a wafer W. The unit 310 has a wafer-conveying mechanism 342 for conveying wafers W to, and received them from, the coating/development device 306.

The coating/development device 306 is designed to coat wafers W with a resist which is sensitive to an electron beam. The device 306 comprises a loader unit 312, a brushing unit 314, a water-washing unit 316, an adhesion unit 318, resist-coating units 320, baking units 322, a cooling unit 324, and development units 326. The loader unit 312 is provided for loading and unloading wafers W. The brushing unit 314 is designed to brush wafers W to clean them. The water-washing unit 316 applies a jet of water onto wafers W to wash them. The adhesion unit 318 is used to treat the surface of a wafer W to render it hydrophobic. The resist-coating units 320 are provided for coating resist on the surface of a wafer W and remove excessive resist from the circumference of the wafer W. The baking units 322 are used to heat wafers W before resist is coated on them, thus performing pre-baking, and also to heat the wafers W after the resist is coated on them, accomplishing post-baking. The cooling unit 324 is located below the adhesion unit 318, for cooling wafers W to a predetermined temperature. The development units 326 are designed to develop wafers W which has been exposed to light in the electron-beam exposure device 302, and to rinse the resist patterns formed on the wafers by means of development.

Two main convey paths 328 and 334 extend along the center line of the coating/development section 306, axially aligned with each other and spaced from each other. Two main convey arms 332 and 334 are provided, movable along the main convey paths 328 and 334, respectively. The processing units 314, 318, 322 and 324 are arranged on one side of the main convey paths 328 and 334, while the other processing units 316, 320 and 326 are arranged on the other side of the paths 328 and 334. A waiting table 336 is provided between the main convey paths 328 and 334, for transferring wafers W between the main convey arms 332 and 334.

The coating/development device 306 has a cassette table 364 at one end. Mounted on the table 364 are four cassettes C for containing processed wafers W until the wafers W are subjected to the next process. The electron-beam exposure device 302 has a cassette stage 340. Four cassettes C, each for containing, for example, 25 wafers, are mounted on the cassette stage 340.

The processing system 304 has a cassette-conveying mechanism 366, which is provided between the cassette stage 340 and the cassette table 364 for conveying the cassettes C between the stage 340 and the table 364. As shown in FIGS. 20 and 23, the mechanism 366 can move in X-axis and Y-axis direction (in a horizontal plane) and Z-axis direction (in vertical direction) and can rotate in the direction of arrow θ.

The loader unit 312 of the coating/development device 306 has two cassettes 344 for containing unprocessed wafers and two cassettes 346 for containing processed wafers. From one of the cassettes 344 the arm 332, one of the main convey arms, removes unprocessed wafers W. The main convey arm 332 is moved along the convey path 328, conveying the wafers W to the processing units 314, 316, 318, 320, 322 and 324 which are arranged on both sides of the convey path 328. The wafers W are coated with resist as they are processed in the respective processing units. The arm 332 conveys the resist-coated wafers W into a cassette C (not shown) placed on the waiting table 340. The other main convey arm 334 holds these wafers W. The arm 334 is moved along the convey path 330, conveying the wafers W to the processing units 322 and 326 which are arranged on both sides of the convey path 330. The wafers W are developed as they are processed in the processing units 322 and 326. The arm 334 conveys the developed wafers W into one of the cassettes C mounted on the cassette table 364. The cassette-conveying mechanism 366 holds the cassette C containing the developed wafers W and transfers the cassette C from the cassette table 364 onto the cassette stage 340 of the wafer-conveying unit 310. Then, the wafer-conveying mechanism 342 of the unit 310 removes the first wafer W from the cassette C and conveys it into the electron-beam exposure unit 302A. In the unit 302A, the wafer W is applied with an electron beam, thus exposed with light.

The wafer-conveying mechanism 342 of the unit 310 conveys the wafer, thus exposed to light, from the unit 302A back into the cassette C mounted on the cassette stage 340. Then, the mechanism 342 conveys the other wafers W, one at a time, from the cassette C into the electron-beam exposure unit 302A, and convey them, one at a time, from the unit 302A back into the cassette C. After all wafers W exposed to light have been inserted into the cassette C, the cassette-conveying mechanism 366 holds the cassette C containing the wafers W and transfers the cassette C from the cassette stage 340 onto the cassette table 364 of the coating/development device 306.

Thereafter, the main convey arm 334 conveys the wafers from the cassette C to the development units 326 as it is moved long the convey path 330. The wafers W are developed in the units 326 and conveyed by the arm 334 onto the waiting table 336. Then, the main convey arm 332 conveys the wafers W from the table 336 to the loader unit 312 as it moves along the convey path 328. The wafers W are finally inserted into one of the cassettes 346.

The electron-beam exposure device 302 will now be described in detail. As shown in FIGS. 21 and 22 and as has been described, the device 302 comprises the electron-beam exposure unit 302A and the wafer-conveying unit 310. The unit 302A has a vacuum chamber 348 and an electron gun 350. The chamber 348 is provided for containing a wafer Which is to be processed. The electron gun 350 is used to apply an electron beam on to a wafer contained in the vacuum chamber 348. The unit 302A can process each wafer W under prescribed conditions. The vacuum chamber 348 is connected to a vacuum system 356 which has a valve 352 and a vacuum pump 354. The chamber 348 is also connected to by a valve to a gas-supplying system 360 which is used to supply an inert gas or the like into the vacuum chamber 348. Hence, a vacuum can be created in the chamber 348, and gas purging can be achieved therein.

A gate valve 358 which can be opened and closed is located on one side of the vacuum chamber 348. When closed, the gate valve 358 maintains the chamber 348 airtight. When opened, it allows the passage of a wafer W into or from the vacuum chamber 348.

The electron gun 350 is driven by a gun-driving system 350A, the vacuum system 356 by a vacuum-system driving system 356A, and the wafer-conveying mechanism 342 by a driving system 342A having an electric motor and the like. The other movable components of the electron-beam exposure device 302 are driven by driving systems (not shown). The driving systems operate in accordance with instructions sent from a control section 362 which comprises a microcomputer or the like.

The control section 362 and a few components associated with the section 362 will be described, with reference to FIG. 19. As FIG. 19 clearly shows, the control section 362 comprises a first storage unit 370, a grouping/scheduling unit 372, a second storage unit 374, a process instruction generator 378, and a memory 380. The first storage unit 370 has a RAM or the like for storing the data input from a data input device 368. The data input device 368 is provided outside the control section 362 and has its output connected to the grouping/scheduling unit 372 and its input connected to a host computer. The grouping/scheduling unit 372 is designed to read the data from the first storage unit 370, to divide wafers W into groups in accordance with the conditions under which to process the wafers W and to prepare a schedule of processing the wafers. The second storage unit 374 has a RAM or the like for storing the schedule made by the grouping/scheduling unit 372. The process instruction generator 378 is designed to read the schedule from the second storage unit 374 and to generate process instructions based on the schedule. The process instructions are supplied to the drive systems 376 including the gun-driving system 350A, the vacuum-system driving system 356A and the driving system 342A.

The data input device 368 is provided to input the conditions (i.e., recipe) of processing the wafers contained in each cassette C mounted on the cassette stage 340 and also the cassette ID data identifying the cassette C. The cassette ID data is associated with with the wafer-processing conditions. The wafer-processing conditions and the cassette ID data may be either generated by operating the data input device 368 or sent from a host computer (not shown) to the data input device 368 via a communication line.

The grouping/scheduling unit 372 divides the wafers contained in each cassette C into groups in accordance with the conditions under which the wafers are to processed. For example, the unit 372 forms a group of wafers which are to have the same circuit pattern formed on them, so that these wafers may be continuously processed, one after another, under the same conditions. Further, the grouping/scheduling unit 372 prepares such a wafer-processing schedule that the wafers of any group which are to be processed under a few conditions are processed before those of a group which are to be processed under more conditions.

The wafer-processing schedule thus prepared is stored into the second storage unit 374, along with the cassette ID data and the wafer-processing conditions. The wafer-processing conditions may be encoded and then stored into the memory 380 (RAM) connected to the process instruction generator 378. The process instruction generator 378 can then refer to the encoded wafer-processing conditions to generate process instructions based on the wafer-processing schedule.

While the wafers of one group are being processed one after another in the vacuum chamber 348, a cassette C containing unprocessed wafers may be placed onto the cassette stage 340. If this is the case, the cassette ID data identifying this cassette and the conditions for processing the wafers contained in this cassette are stored, in the form of a table, into the first storage unit 370. Then, the grouping/scheduling unit 372 divides the wafers excluding the processed ones into new groups in accordance with the conditions under which the wafers are to be processed, thereby forming new groups of wafers. The data showing the new wafer groups is stored into the second storage unit 374, whereby the wafer-processing schedule is updated. In accordance with the schedule thus updated, a wafer or wafers, if any in the new cassette, which are to be processed under the same conditions as the wafers are now being processed in the vacuum chamber 348 will be processed before the other wafers Which are contained in the preceding cassette and which are to be processed under different conditions.

It will be explained how the processing system shown in FIG. 20 processes performs the processing method according to the third embodiment of the invention.

First, wafers W are subjected resist-coating one after another in the coating/development device 306 which is located upstream of the processing system. The resist-coated wafers W are inserted into cassettes C. The cassettes C are sequentially conveyed from the cassette table 364 by the cassette-conveying mechanism 366 and then mounted onto the cassette stage 340 of the electron-beam exposure device 302. The wafer-conveying mechanism 342 conveys the resist-coated wafers W, one by one, from each cassette C into the vacuum chamber 348. Each wafer W is subjected electron-beam exposure. Although four cassettes C are shown in FIG. 20, placed on the table 340, more or less cassettes may be mounted onto the cassette stage 340. Further, additional cassettes, each containing a plurality of wafers, may be mounted while other wafers W are being in the electron-beam exposure device 302.

The wafers W processed in the device 302 are inserted into the cassettes C placed on the cassette stage 340, one after another. When any cassette C becomes full, it is conveyed by the cassette-conveying mechanism 366 onto the cassette table 364 of the coating/development device 306. The wafers C can then be removed from the cassette C and supplied into, for example, the development units 326. Other wafers W can then be inserted into the cassette C.

When the cassette-conveying mechanism 366 conveys any cassette C from the cassette table 364 of the coating/development device 306, the cassette ID data identifying this cassette and the conditions for processing the wafers contained in this cassette are stored, in the form of a table, into the first storage unit 370. Thus, the data necessary for processing the wafers W now contained in the cassette C has been input. The conditions for processing each or some of the wafers W contained in the cassette C in the vacuum chamber 348 may differ from those for processing any other or some other wafers in the vacuum chamber 348, if the wafers W are large ones such as of 12-inch wafers.

Next, the grouping/scheduling unit 372 reads the data from the first storage unit 370. Based on the data the unit 372 forms groups of wafers, each consisting of wafers which are to have the same circuit pattern formed on them, so that these wafers may be continuously processed, one after another, under the same conditions. Then, the unit 372 prepares such a wafer-processing schedule that the wafers of any group which are to be processed under a few conditions are processed before those of a group which are to be processed under more conditions. Furthermore, the schedule is such that the wafers W contained in any cassette C, which are to be processed under a few conditions (e.g., one condition A), will be processed before the wafers W contained in any other cassette C, which must be processed under more conditions (e.g., conditions A and B).

Further, the wafer-processing schedule thus prepared is stored into the second storage unit 374, along with the cassette ID data and the wafer-processing conditions. Here ends the step of grouping wafers and preparing the wafer-processing schedule.

Thereafter, the process instruction generator 378 reads the schedule from the second storage unit 374 and generates process instructions from the schedule. The process instructions are supplied to the drive systems 376 including the gun-driving system 350A, the vacuum-system driving system 356A and the driving system 342A. In accordance with the instructions the gun-driving system 350A drives the electron gun 350. The gun 350 applies an electron beam onto each of the wafer W of the first group, located in the vacuum chamber 348, forming a circuit pattern on the wafer W. The other wafers W of the first group are processed, one at a time, in the vacuum chamber 348, whereby the same circuit pattern is formed on each of the wafers F. Some time after the last wafer W of the first group has been thus processed, the wafers W of the second group on which a different circuit pattern is to be formed are processed, one at a time, in the vacuum chamber 348. The wafers F of any other group are similarly processed, one at a time, in the chamber 343, to have different circuit patterns formed on them.

The electron-beam exposure must be suspended for tens of minutes before the wafers W of the next group are processed, in order to stabilize the electron beam in preparation for forming a different pattern on the wafers W. Nonetheless, of the wafers W contained in each cassette C, those to be processed under the same conditions can be continuously processed, one after another. This minimizes the number of times the electron-beam exposure must be interrupted and the time for which the electron-beam exposure must be suspended, ultimately enhancing the efficiency of processing wafers.

Further, since the wafers W contained in any cassette C, which are to be processed under a few conditions, will be processed before the wafers W contained in any other cassette C, which must be processed under more conditions, it is possible to process all wafers contained in each cassette within a shorter time than otherwise. Thus, the next cassette C can be conveyed onto the cassette stage 340 sooner.

When the new cassette C is placed on the cassette stage 340, the cassette ID data identifying this cassette and the conditions for processing the wafers contained in this cassette are stored into the first storage unit 370. Then, the grouping/scheduling unit 372 reads the data from the first storage unit 370, and forms new groups of wafers W based on the data. The data showing the new wafer groups is stored into the second storage unit 374, whereby the wafer-processing schedule is updated. In accordance with the schedule thus updated, a wafer or wafers, if any in the new cassette, which are to be processed under the same conditions as the wafers are now being processed in the vacuum chamber 348 will be processed before the other wafers Which are contained in the preceding cassette and which are to be processed under different conditions.

A particular wafer-processing schedule, which the grouping/scheduling unit 372 formulates, will be explained with reference to FIGS. 24, 25 and 26.

Let us assume that three cassettes C1 to C3 are mounted on cassette stage 340 as is illustrated in FIG. 24, and that each cassette contains 18 wafers. In FIG. 24, each white dot indicates a wafer to be processed under condition A, each double-circle a wafer to be processed under condition B, and each black dot a wafer to be processed under condition C.

How the grouping/scheduling unit 372 forms groups of wafers and formulates a schedule so that the wafers may be processed within the shortest possible time.

First, the wafers contained in the cassettes C1 to C3 are divided into groups, according to the condition under which they are to be processed. Hence, twelve wafers contained in the cassette C1, which are to be processed under condition A, and all wafers (18 wafers) contained in the cassette C2 make a first group; the six wafers contained in the cassette C3, which are to be processed under condition B, form a second group; and the remaining six wafers contained in the cassette C1, which are to be processed under condition C, and the remaining twelve wafers contained in the cassette C3, which are to be processed under condition C, form a third group. Next, it is determined that the wafers contained in the cassette C2 should be processed before the wafers contained in the cassettes C1 and C3 because they are all to be processed under the same condition (i.e., condition A); that those twelve wafers contained in the cassette C1 should be processed immediately after the last wafer in the cassette C2 is processed since they are to be processed under the same condition (i.e., condition A) as the wafers contained in the cassette C2.

As a result, the grouping/scheduling unit 372 schedules that the groups of wafers be processed in the order specified below:

1. Wafers contained in the cassette C2, which are to be processed under condition A
2. Wafers contained in the cassette C1, which are to be processed under condition A
3. Wafers contained in the cassette C1, which are to be processed under condition C
4. Wafers contained in the cassette C3, which are to be processed under condition C
5. Wafers contained in the cassette C3, which are to be processed under condition B Let us further assume that, as shown in FIG. 25, a cassette C3 containing 18 wafers all to be process under condition A is conveyed onto the cassette stage 340, on which two cassettes C1 and C2 have already been mounted while the grouping/scheduling unit 372 is formulating a processing schedule for the wafers contained in the cassettes C1 and C2, in the same way as as has been explained with reference to FIG. 24.

In this case, the data representing condition A under which all wafers contained in the cassette C3 is input to the processing system. Then, the grouping/scheduling unit 372 divides the wafers contained in the wafers C1, C2 and C3 and the wafers already removed from the cassette C1 and/or the cassette C2 and being processed, into groups in accordance with conditions A, B and C under which the wafers contained in the cassettes C1 to C3 are to be processed and the wafers removed from the cassette C1 and/or the cassette C2 are being processed. Next, the grouping/scheduling unit 372 formulates a schedule so that the wafers of each group may be processed continuously, one after another.

Thus, if the wafers removed from the cassette C1 and/or the cassette C2 are being processed under condition A when the cassette C3 is conveyed onto the cassette stage 340, the wafers contained in the cassette C3 will be processed after the wafers removed from the cassette C1 and/or the cassette C2 have been processed under condition A. For instance, at least one of the wafers removed from the cassette C1 or C2 may be processed under condition A, whereas none of the wafers contained in the other of these cassettes have yet to be processed under condition A, when the cassette C3 may be conveyed onto the cassette stage 340. If so, all wafers contained in the cassette C3 will be immediately processed under condition A before the wafers which are contained in the other of the cassettes C1 and C2 and which are to be processed under other conditions.

Let us still further assume that, as shown in FIG. 26, a cassette C3 containing 12 wafers to be processed under condition A and 6 wafers to be processed under condition B is conveyed onto the cassette stage 340, on which two cassettes C1 and C2 have already been mounted as shown in FIG. 25, while the grouping/scheduling unit 372 is formulating a processing schedule for the wafers contained in the cassettes C1 and C2. In this case, too, the wafers contained in the cassette C3 will be processed under condition A after the wafers removed from the cassette C1 and/or the cassette C2 have been processed under condition A, since the cassette C3 is conveyed onto the stage 340 while the wafers removed from the cassette C1 and/or the cassette C2 are being processed under condition A.

The processing method will be explained in greater detail, with reference to the flow chart of FIG. 27.

First, one or more cassettes, each containing wafers, are conveyed onto the cassette stage 340 (Step S21). The conditions under which the wafers contained in each cassette are to be processed are input from the data input device 368 into the first storage unit 370, along with ID data identifying the cassette (Step S22). The wafer-processing conditions and the cassette ID data are stored in the form of a data table.

Next, the grouping/scheduling unit 372 reads the data stored in the first storage unit 370 and divides, based on the data, the wafers contained in the wafers into groups such that the wafers of each group may be processed continuously under the same condition. Further, the unit 372 formulates a schedule, determining which wafers, i.e., some of the wafers contained in any cassette, should be processed first (Step S23). The schedule, thus formulated, is stored into the second storage unit 374 (Step S24). How the schedule is formulated will be explained later.

The process instruction generator 378 reads the schedule from the second storage unit 374 and generates process instructions from the schedule and supplies them to the drive systems 376, whereby a circuit pattern to be formed on each wafer is selected, the processing temperature and pressure are adjusted, and each wafer is processed (Step S25).

While the wafers are being processed, it is determined whether or not a new cassette containing unprocessed wafers has been conveyed onto the cassette stage 340 (Step S26). If NO, that is, if no new cassette has been mounted on the stage 340, the flow returns to Step S25. Hence, the wafers are processed one after another until a new cassette is conveyed onto the cassette stage 340. If YES in Step S26, that is, if a new cassette has been mounted on the stage 340, the conditions under which the wafers contained in the new cassette are to be processed are input into the first storage unit 370, thus renewing the data stored therein. The grouping/scheduling unit 372 forms groups of wafers and formulate a new wafer-processing schedule on the basis of the renewed data stored in the first storage unit 370, and the new schedule is stored into the second storage unit 374, thereby renewing the wafer-processing schedule (Step S27). Thereafter, the wafers Will be processed in accordance with the schedule thus renewed, and the schedule will be renewed every time a new cassette is conveyed on the cassette stage 340.

The method of forming groups of wafers and the method of preparing a wafer-processing schedule will be explained in more detail, with reference to FIG. 28 and FIGS. 29A to 29G.

Assume that, as shown at (1) in FIG. 29A, seven cassettes C1 to C7 are mounted on the cassette stage 340, and that the conditions under which the wafers contained in the cassettes C1 to C7 have already been stored into the first storage unit 370. In FIGS. 29A to 29G, letters A to G indicate the wafers and also the conditions under which these wafers are to be processed. Thus, as shown in FIG. 29A, the cassette C1 contains, for example, contains two wafers Which should be processed under condition A. The scheduling logic is two folds: (1) wafers to be processed under the same condition should be processed continuously; and (2) all wafers contained the same cassette should be processed as soon as possible so that the cassette may be moved from the stage 340 to allow a new cassette to be conveyed onto the stage 340. For simplicity of explanation, the time required to process each wafer under a specific condition will not taken into consideration.

First, the condition under which each wafer is to be processed and the ID data identifying the cassette containing the wafer are read from the first storage unit 370 to the grouping/scheduling unit 372 (Step S23-1). The unit 372 divides the wafers into groups in accordance with the conditions for processing the wafers, and selects one or more of the cassettes C1 to C7, which contain wafers to be processed under less conditions than those contained in any other cassette (Step S23-2). In the instance shown in FIG. 29A, the unit 372 selects the cassettes C1, C2 and C5, which contains respectively two wafers to be processed under one condition (i.e., condition A), one wafer to be processed under one condition (i.e., condition B), and two wafers to be processed under one condition (i.e., condition B).

Next, the grouping/scheduling unit 372 selects one of these cassettes, which contains less wafers than the others (Step S23-3). More precisely, the unit 372 selects the cassette C2 because this cassette contains one wafer, while the cassettes C1 and C5 contains two wafers each. Then, the unit 372 selects the condition under which one or more wafers contained in the cassette selected in Step S23-3, which are less in numbers than other wafers Which are contained in that cassette and which are to be processed under any other condition (Step S23-4). In this instance, the unit condition 372 selects condition B under which the sole wafer B contained in the cassette C2 selected in Step S23-3 should be processed.

Further, the grouping/scheduling unit 372 determines the order in which the cassettes should arranged to facilitate the conveying of wafers Which should be processed under the condition selected in Step S23-4 (i.e., condition B) (S23-5). First, the unit 372 determines the order such that the cassette containing wafers to be processed under less conditions is placed before any other cassette selected in Step S23-2 (Step S23-6). In the present instance shown in FIG. 29A, the cassette C2 or C5 is arranged in the first place since either contains a wafer B or wafers B which are be processed under condition B only, and the cassette C7 is positioned in the third place since it contains two wafers B and E which are to be processed under different conditions B and E. Then, the unit 372 determines the order such that the cassette containing less wafers to be processed under the condition selected in Step S23-4 (i.e., less wafers B) is placed before any other cassette selected in the Step S23-2 (Step S23-7). As a result, in the case shown in FIG. 29A, the cassettes C2, C5 and C7 will be arranged in the order mentioned, since the cassette C2 contains one wafer B, while the cassette C5 contains two wafers B.

Next, the sequence of Steps S23-1 to S23 is repeated for all wafers other than those which are to be processed under the condition selected in Step S23-4 (i.e., condition B), thereby formulating a wafer-processing schedule, i.e., the order in which the wafer-processing conditions A and C–G should be applied and the order in which the cassettes C1 to C7 should be arranged (Step S23-8). In the case shown in FIG. 29A, conditions B, E, A, F, G, C and D will be applied in the order mentioned.

Hence, as shown in FIG. 29B, the cassettes C2 and C5 respectively containing one wafer B and two wafers B will be first conveyed from the cassette stage 340, and the wafer E is removed from the cassette C7 to the processing device. Then, as shown in FIG. 29C, the cassette C7 now containing a wafer E will be conveyed from the stage 340, and the wafer E will be removed from the cassette C4 to the device. Next, the cassette C1 and C4, each containing two wafers A now, will be conveyed from the table 340 to the device as is illustrated in FIG. 29D. Further, as shown in FIG. 29E, the wafer F will be supplied to the processing device from the cassette C5 which is mounted on the stage 340, along with the cassette C3 containing one wafer C and two wafers D. Then, as shown in FIG. 29F, the wafer G will be supplied to the device from the cassette C6, which is now empty and hence conveyed from cassette stage 340. Next, as shown in FIG. 29G, the wafer C will be supplied to the processing device from the cassette C3 which is the last one remaining on the stage 340.

After all, the wafers will be removed from the cassettes C1 to C7 to the processing device, in the order shown below:

C5(B), C7(B), C7(E), C4(E), C1(A), C4(A), C6(F), C6(G), C3(C), and C3(D)

where the letter in each parenthesis indicates the condition for processing the wafer or wafers removed from each cassette.

In the state depicted in FIG. 29C, the cassette C1 may conveyed from the cassette stage 340, either before or after the cassette C4. This is because either cassette contains two wafers to be processed under the same condition, i.e., condition A. Furthermore, in the state shown in FIG. 29D, it does not matter which one of the two wafers F and G is first removed from the cassette C6, because no wafers to be possessed under condition F or G are contained in the cassette C3 which is only another cassette remaining on the stage 340.

In accordance with the schedule thus formulated in Step S23-8, the wafers are processed under conditions A to G, which are applied in the order specified above. While the wafers are being processed in accordance with the schedule, a new cassette may be conveyed onto the cassette stage 340. If this is the case, the grouping/scheduling unit 372 reads the conditions for processing the wafers contained in the new cassette, and repeats the sequence of Steps S23-1 to S23-8 for all wafers including those contained in the new cassette and excluding those already processed, thereby updating the schedule. The wafers the new cassette contains may include at least one wafer which should be processed the very condition being applied to in a processing device. In this case, the new cassette is arranged so that said at least one wafer will immediately processed (Step S23-9).

As indicated above, in the third embodiment, all wafers to be processed are divided into groups in accordance with the conditions the conditions for processing the wafers, and the wafers to be processed under the same condition are continuously processed, one after another. Hence, the processing is interrupted less often than, each time for a shorter time than, in the case where no wafers removed from a cassette can be processed until all wafers removed from a preceding cassette are processed, as in the conventional processing method. The through put of processing wafers is therefore great. Even if wafers to be processed under different conditions are contained in the same cassette, they can be orderly managed and efficiently processed.

Of the wafers to be processed under the same condition, those removed from any cassette which contains wafers to be processed under less conditions than those contained in any other cassette are first processed. Thus, all wafers contained in each cassette can be processed faster than otherwise and the cassette can be sooner conveyed from the cassette stage 340, allowing a new cassette to be conveyed onto the stage 340 sooner. This also serves to enhance the efficiency of processing wafers.

Every time a new cassette is mounted on the stage 340, the conditions under which the wafers contained in the new cassette are to be processed are input into the first storage unit 370, thus renewing the data stored therein, and the grouping/scheduling unit 372 forms groups of wafers and formulate a new wafer-processing schedule on the basis of the renewed data. The wafers can, therefore, be processed with even higher efficiency.

In the processing systems shown in FIG. 20 incorporate an electron-beam exposure device each. According to the invention, however, the electron-beam exposure device 302 may be separated from the coating/development device. If this is the case, either an operator or an AGV places cassettes on the cassette stage 340.

Furthermore, the electron-beam exposure device 302 may be replaced by any other wafer-processing device such as an etching device, a coating/developing device, a metal-film forming device, a CVD device, or the like. Any one of these alternative wafer-processing devices is driven by a drive system. The drive system is controlled to switch the condition for processing wafers in the device, to another condition, thus changing the processing gas, the processing pressure, the processing temperature and the like. The device may processes wafers in accordance with a schedule of the type described above, to shorten the time for applying an electron beam onto the resist film formed o each wafer, post-baking the resist film and developing the resist film.

Moreover, the processing systems shown in FIG. 20 can be used to process LCD substrates, glass substrates, and the like, instead of semiconductor wafers.

As has been described, in the processing all objects to be processed are divided into groups in accordance with the conditions the conditions for processing the wafers, and the objects to be processed under the same condition are continuously processed, one after another. Therefore, the processing is interrupted less often than, each time for a shorter period than, in the case where no objects removed from a container can be processed until all objects removed from a preceding container are processed, as in the conventional processing method. The throughput of processing objects is therefore high. Even if objects to be processed under different conditions are contained in the same container, they can be orderly managed and efficiently processed.

Further, of the objects to be processed under the same condition, those removed from any container which contains objects to be processed under less conditions than those contained in any other container are first processed. Thus, all objects contained in each container can be processed faster than otherwise and the container can be sooner conveyed from a container stage, allowing a new container to be conveyed onto the stage sooner. This also serves to enhance the efficiency of processing objects.

Every time a new container is mounted on the stage, the conditions under which the objects contained in the new container are to be processed are input into a data storage unit, thus renewing the data stored therein, and a new wafer-processing schedule is formulated on the basis of the renewed data. The objects can, therefore, be processed with even higher efficiency, which enhances the throughput of processing objects.

The first to third embodiment can be employed in any possible combination, if necessary.

In the processing system according to the present invention, objects can be conveyed at high speed among the processing devices as described above. Hence, the system can accomplish a high throughput.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A processing system for subjecting a given process to at least some of a plurality of objects contained in a plurality of cassettes in accordance with predetermined process conditions comprising:

an input unit configured for receiving process conditions of the processes to be performed on the objects and cassette ID data identifying the cassettes;

a first storage unit configured for storing the process conditions and the cassette ID data;

a grouping/scheduling unit configured for grouping the objects contained in the plurality of cassettes into one or more object groups each including the objects to be processed under a same process condition, for each of the cassettes in accordance with the process conditions and scheduling the process of the objects to form a group schedule, said grouping/scheduling unit including means for re-grouping the objects contained in the plurality of cassettes together with the objects contained in a new cassette for each of the cassettes to form a new group schedule when the new cassette is added to the plurality of cassettes;

a second storage unit configured for storing the group schedule;

a process instruction generator configured for generating a process instruction in accordance with the group schedule; and a process unit configured for processing the objects in accordance with the process instruction.

2. The processing system according to claim 1, wherein the cassettes contain the objects to be processed under the same process condition, and said grouping/scheduling unit is further configured to select the objects to be processed under the same process condition from the objects of the plurality of cassettes, to group the selected objects as one group, and to write the group in said second storage unit for every cassette.

3. The processing system according to claim 2, wherein said cassettes each contains a plurality of semiconductor wafers, LCD substrates or glass substrates as the objects to be processed.

4. The processing system according to claim 3, wherein said process unit is further configured to subject the objects to the process including at least one of coating a resist on the objects, exposing the objects to form circuit patterns thereon, and developing the exposed objects.

5. The processing system according to claim 2, wherein said process unit is further configured to process the objects of the cassettes which belong to the one group under the same process condition, together.

6. The processing system according to claim 5, wherein said cassettes each contains a plurality of semiconductor wafers, LCD substrates or glass substrates as the objects to be processed.

7. The processing system according to claim 6, wherein said process unit is further configured to subject the objects to the process including at least one of coating a resist on the object, exposing the objects to form circuit patterns thereon, and developing the exposed objects.

8. The processing system according to claim 1, wherein the cassettes contain the objects to be processed under different process conditions, and said grouping/scheduling unit includes means for forming a plurality of object groups corresponding to the different process conditions, respectively, and means for determining an order in which the object groups are processed by said process unit.

9. The processing system according to claim 8, wherein said cassettes each contains a plurality of semiconductor wafers, LCD substrates or glass substrates as the objects to be processed.

10. The processing system according to claim 9, wherein said process unit is further configured to subject the objects to the process including at least one of coating a resist on the objects, exposing the objects to form circuit patterns thereon, and developing the exposed objects.

11. The processing system according to claim 8, wherein said determining means determines the order in which the object groups are processed in ascending order beginning with the object group which requires the shortest process time from said process unit.

12. The processing system according to claim 8, which includes a storage configured for storing a table having information relating to an order in which the object groups are processed by said process unit.

13. The processing system according to claim 8, wherein the plurality of objects groups each includes a plurality of objects to be processed under the same process condition but different from that of the other of the object groups, and said process unit processes the objects of the cassettes which belong to the group to be processed under the same process condition, together.

14. The processing system according to claim 1, wherein said grouping/scheduling unit includes means for re-grouping the objects together with a plurality of new objects of at least one cassette newly added to the cassettes and updating the group schedule.

15. The processing system according to claim 14, wherein said cassettes each contains a plurality of semiconductor wafers, LCD substrates or glass substrates as the objects to be processed.

16. The processing system according to claim 15, wherein said process unit is further configured to subject the objects to the process including at least one of coating a resist on the objects, exposing the objects to form circuit patterns thereon, and developing the exposed objects.

17. The processing system according to claim 14, wherein said grouping/scheduling unit is further configured to update the group schedule to process at least some of the new objects to be processed under the same condition as the preceding objects now being processed, before the preceding objects to be processed under the different conditions.

18. The processing system according to claim 14, wherein said grouping/scheduling unit includes means for forming a plurality of object groups corresponding to the different process conditions and means for determining an order in which the object groups are processed by said process unit.

19. The processing system according to claim 18, wherein said cassettes each contains a plurality of semiconductor wafers, LCD substrates or glass substrates as the objects to be processed.

20. The processing system according to claim 19, wherein said process unit is further configured to subject the objects to the process including at least one of coating a resist on the objects, exposing the objects to form circuit patterns thereon, and developing the exposed objects.

21. The processing system according to claim 8, wherein said determining means determines the order in which the object groups are processed in ascending order beginning with the object group which requires the shortest process time from said process unit.

22. The processing system according to claim 1, which includes a storage unit configured for storing a table having information relating to an order in which the object groups are processed by said process unit.

23. The processing system according to claim 1, wherein said grouping/scheduling unit is configured to formulate an order in which the process conditions should be applied and an order in which the cassettes should be arranged.

24. The processing system according to claim 1, wherein said grouping/scheduling unit is supplied with the process conditions, setting parameters from a setting table and time parameters from a time administration table and is configured to formulate a scheduling algorithm on the basis of the process conditions, the setting parameters and the time parameters.

25. The processing system according to claim 24, wherein said setting table includes setting parameters set by at least one of an operator and a host computer.

26. The processing system according to claim 24, wherein said time administration table includes time parameters determined by at least one of an operator and a host computer in accordance with the process conditions.

27. The processing system according to claim 24, wherein said time administration table stores automatically process times calculated on the basis of actual processing times.

28. The processing system according to claim 24, wherein said cassettes each contains a plurality of semiconductor wafers, LCD substrates or glass substrates as the objects to be processed.

29. The processing system according to claim 28, wherein said process unit is configured to subject the objects to the process including at least one of coating a resist on the objects, exposing the objects to form circuit patterns thereon, and developing the exposed objects.

30. A processing system for subjecting a given process to at least some of a plurality of objects contained in a plurality of cassettes in accordance with predetermined process conditions comprising:

input means for inputting process conditions of the processes to be performed on the objects and cassette ID data identifying the cassettes;

first storage means for storing the process conditions and the cassette ID data;

grouping/scheduling means for grouping the objects contained in the plurality of cassettes into one or more object groups each including the objects to be processed under a same process condition, for each of the cassettes in accordance with the process conditions and scheduling the process of the objects to form a group schedule, said grouping/scheduling means including means for re-grouping the objects contained in the plurality of cassettes together with the objects contained in a new cassette for each of the cassettes to form a new group schedule when the new cassette is added to the plurality of cassettes;

second storage means for storing the group schedule;

process instruction generator means for generating a process instruction in accordance with the group schedule; and process means for processing the objects in accordance with the process instruction.

31. A processing system for subjecting a given process to at least some of a plurality of objects contained in a plurality of cassettes in accordance with predetermined process data comprising:

an input unit configured to receive process data relating to each object to be processed, including each process to be performed on a particular object, and process conditions of each process to be performed on each object, said input unit configured to receive cassette ID data identifying the cassettes;

a first storage unit configured to store the process data and the cassette ID data;

a grouping/scheduling unit configured to group the objects into a plurality of object groups each including the objects to be processed under a same process condition, and scheduling the processing of the objects to form a group schedule;

a second storage unit configured to store the group schedule;

a process instruction generator configured to generate a process instruction in accordance with the group schedule; and a process unit configured to process the objects in accordance with the process instruction.

32. The processing system according to claim 31, wherein said grouping/scheduling unit is further configured to re-group the objects when a new cassette is loaded, into groups of objects to be processed under the same process condition.

33. The processing system according to claim 31, wherein the objects are semiconductor wafers and the same process condition is an electron exposure pattern.

* * * * *